US010994831B1

(12) United States Patent
Graber et al.

(10) Patent No.: US 10,994,831 B1
(45) Date of Patent: May 4, 2021

(54) TEMPERATURE MANAGEMENT SYSTEMS FOR AERIAL VEHICLES

(71) Applicant: Amazon Technologies, Inc., Seattle, WA (US)

(72) Inventors: Sarah Graber, Seattle, WA (US); Benjamin Griffin Novak, Seattle, WA (US); Joshua John Watson, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/715,474

(22) Filed: Dec. 16, 2019

Related U.S. Application Data

(62) Division of application No. 15/604,057, filed on May 24, 2017, now Pat. No. 10,543,906.

(51) Int. Cl.
*B64C 19/00* (2006.01)
*B64D 47/00* (2006.01)
*H05K 7/20* (2006.01)

(52) U.S. Cl.
CPC .............. *B64C 19/00* (2013.01); *B64D 47/00* (2013.01); *H05K 7/20336* (2013.01)

(58) Field of Classification Search
CPC ...... B64C 19/00; B64D 47/00; H05K 7/20336
See application file for complete search history.

(56) References Cited

U.S. PATENT DOCUMENTS

| 2005/0174735 | A1 | 8/2005 | Mankaruse et al. | |
| 2016/0244187 | A1* | 8/2016 | Byers | B64C 39/024 |
| 2018/0072431 | A1* | 3/2018 | Sahu | B64D 33/08 |

* cited by examiner

*Primary Examiner* — Yuen Wong
(74) *Attorney, Agent, or Firm* — Athorus, PLLC

(57) ABSTRACT

Temperature management systems for aerial vehicles may include heat pipes that are thermally connected to components that generate heat. The heat pipes may be routed through or adjacent to a propeller or propulsion airflow, or within or across a vehicle airflow, to dissipate heat from the components. A heat pipe may be selected from a plurality of heat pipes based on measured temperatures of components that generate heat, operational characteristics of the aerial vehicle and/or one or more propellers, and/or measured temperatures of other components that may be heated. Additional temperature management systems may include cool air ducts and cool air pipes that may be routed from a propeller or propulsion airflow, or a vehicle airflow, to components that generate heat or other components that may be cooled.

13 Claims, 9 Drawing Sheets

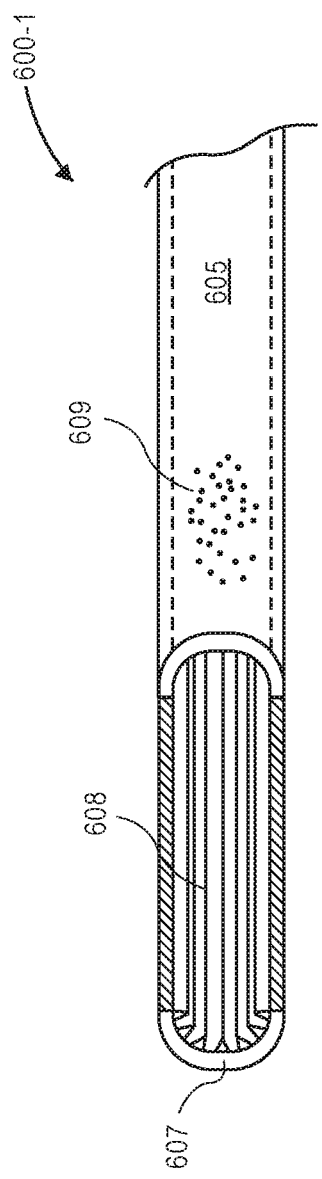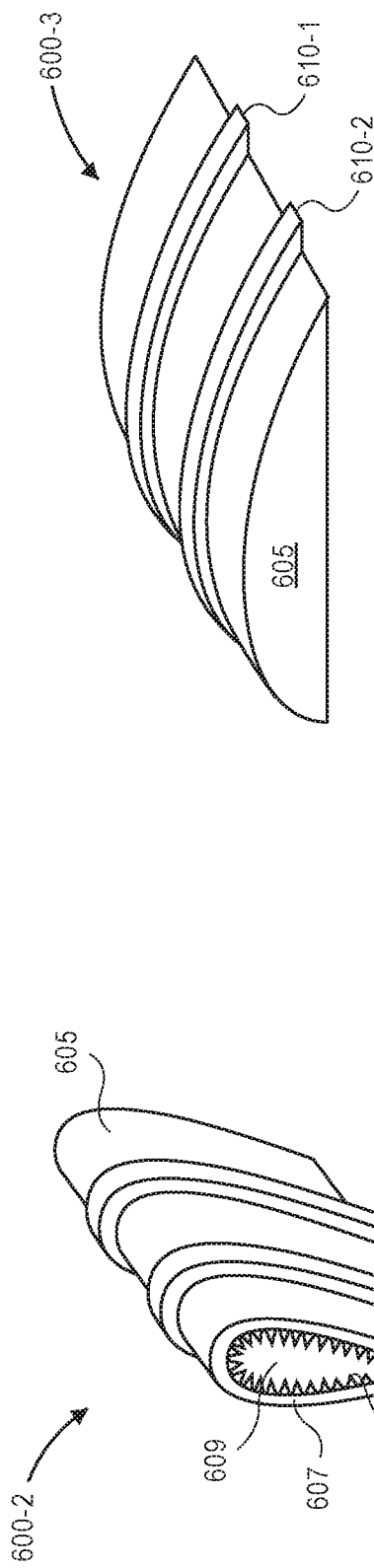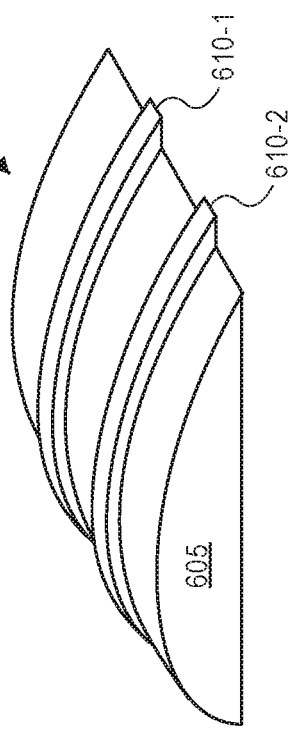

TEMPERATURE MANAGEMENT SYSTEMS FOR AERIAL VEHICLES

CROSS-REFERENCE TO RELATED APPLICATION

This application is a divisional of and claims priority to U.S. application Ser. No. 15/604,057, filed May 24, 2017, the contents of which are herein incorporated by reference in their entirety.

BACKGROUND

Aerial vehicles may include various components such as processors or controllers that facilitate operation and navigation of the aerial vehicles. These components may generate heat during operation of the aerial vehicles. Conventionally, heat sinks may be attached directly to such components to dissipate heat with the use of external fans. However, heat sinks and fans, as well as the processing and control related to such additional components, may increase the weight, complexity, and cost of the aerial vehicles. Accordingly, there is a need for temperature management systems for aerial vehicles that eliminate or minimize any additional weight, complexity, and cost associated therewith, while also improving the dissipation of heat from the various components.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 6A-6C are schematic, perspective view diagrams of example heat pipes, according to implementations.

Figure 1:
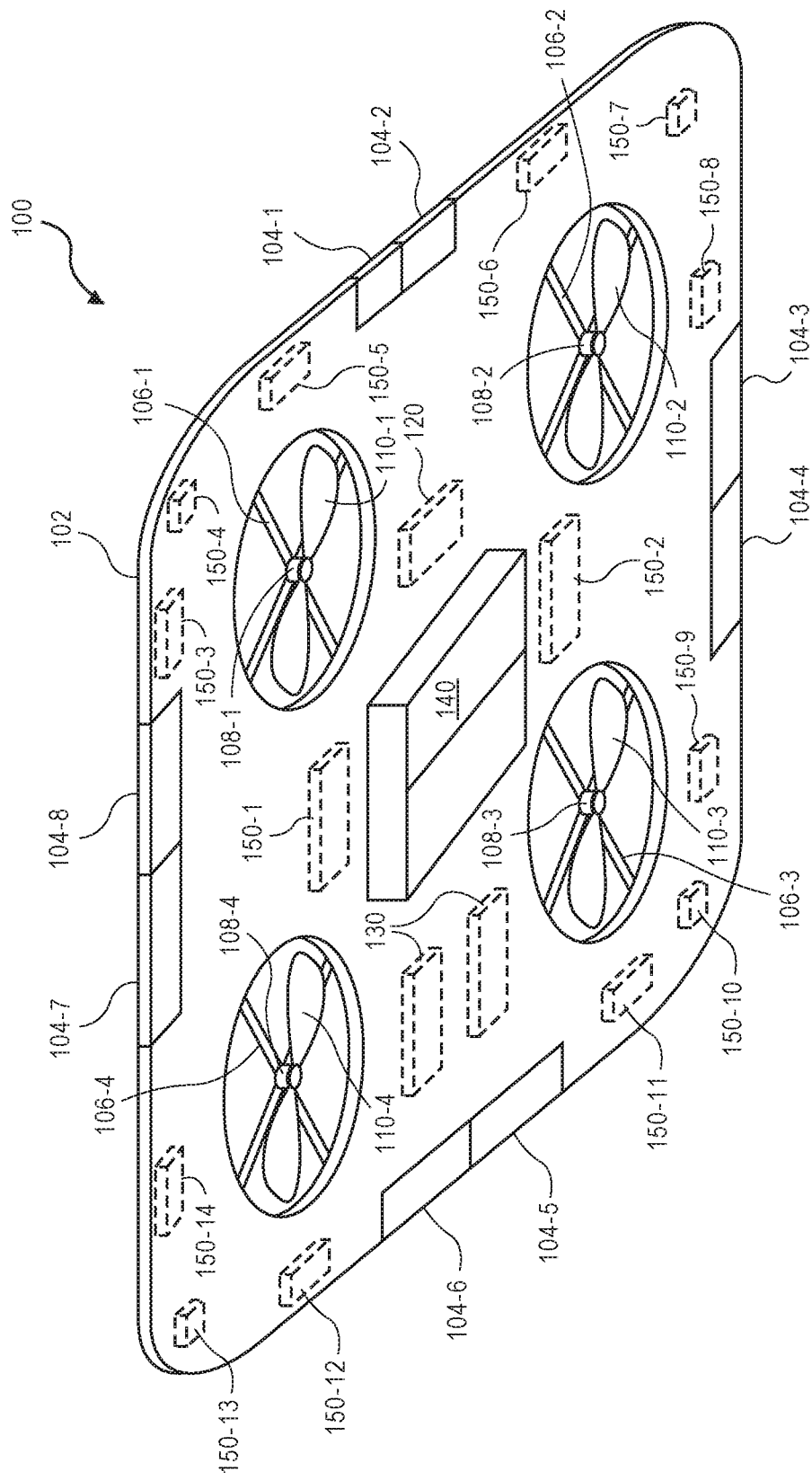
FIG. 1 is a schematic, bottom perspective view diagram of an aerial vehicle, according to an implementation.

While implementations are described herein by way of example, those skilled in the art will recognize that the implementations are not limited to the examples or drawings described. It should be understood that the drawings and detailed description thereto are not intended to limit implementations to the particular form disclosed but, on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Various temperature management systems for aerial vehicles are described in the present disclosure. The aerial vehicles may be implemented in a variety of configurations, and may include propellers rotated by motors that create propeller airflows, other propulsion mechanisms that create respective propulsion airflows, and/or other regions, portions, or surfaces of the aerial vehicles that experience vehicle airflows during operation of the aerial vehicles.

The aerial vehicles may further include various components that generate heat during operation, such as electronic, avionic, operational, navigational, communication, sensory or other components, that are positioned at various locations on the aerial vehicles. Heat pipes may be connected to the various components that generate heat in order to dissipate heat. The heat pipes may be routed to one or more of the propeller airflows, propulsion airflows, and/or vehicle airflows to dissipate heat from the various components.

For example, a heat pipe may be routed from an electronic component that generates heat to a propeller airflow or a propulsion airflow, e.g., within the airflow created by a rotating propeller or an operating propulsion mechanism. In some embodiments, a heat pipe may be routed from an electronic component that generates heat to a periphery of a propeller airflow or a propulsion airflow, e.g., around the periphery of the airflow created by a rotating propeller or an operating propulsion mechanism. In other embodiments, a heat pipe may be routed from an electronic component that generates heat to a region, portion, or surface of the aerial vehicle that experiences a vehicle airflow, e.g., toward an exposed portion of the aerial vehicle or a forward flight direction of the aerial vehicle. In still other embodiments, a heat pipe may be routed from an electronic component that generates heat to a moving component of the aerial vehicle, e.g., a propeller itself.

Within any of the propeller airflow, propulsion airflow, and/or vehicle airflow, the heat pipe may be formed with any cross-sectional shape, e.g., elliptical, circular, polygonal, airfoil, or other aerodynamic shape. In some embodiments, the heat pipe may include a heat sink in the region of the propeller airflow, propulsion airflow, and/or vehicle airflow to increase the surface area available to dissipate heat. The heat sink provided on the heat pipe may also be formed with any cross-sectional shape, e.g., elliptical, circular, polygonal, airfoil, or other aerodynamic shape.

In addition, one or more of the various components that generate heat may include two or more heat pipes that are, or may selectively be, connected to the one or more various components. When a plurality of heat pipes is available for connection to an electronic component, one or more of the heat pipes may be selected for connection based on various factors. For example, a heat pipe may be selected based on a temperature of the electronic component, e.g., based on whether heat may be dissipated from the electronic component. In some embodiments, a heat pipe may be selected based on an operational characteristic of the aerial vehicle and/or one or more propellers or propulsion mechanisms, e.g., based on a flight direction of the aerial vehicle and/or an operational status of the one or more propellers or propulsion mechanisms.

In other embodiments, one or more second components of the aerial vehicle, e.g., batteries, processors, controllers, ailerons, flaps, other control surfaces, motors, propellers, sensors, payload engagement mechanisms, and/or payloads, may be selectively heated by a heat pipe. For example, during operation of the aerial vehicle in cold, wet, snowy, and/or icy environments, a heat pipe that is routed to, through, or near a second component may be selected based on a temperature of the second component, e.g., to maintain the second component in a particular operating temperature range, and/or to maintain a desired temperature of a payload, such as a hot food item.

In still further embodiments, in addition or alternatively to heat pipes, one or more cool air ducts may be provided within or around a periphery of one or more of the propeller airflows, propulsion airflows, and/or vehicle airflows to route cool air to the various components that generate heat. For example, the cool air ducts may connect to cool air pipes in order to route cool air to the various components. Multiple cool air ducts may connect to multiple cool air pipes to be routed to one or more electronic components, multiple cool air ducts may connect to a single cool air pipe to be routed to an electronic component, a single cool air duct may connect to multiple cool air pipes to be routed to one or more electronic components, and/or combinations thereof. Further, one or more of the cool air ducts and/or cool air pipes may be selectively closed and/or opened based on various factors, e.g., based on temperatures of one or more electronic components to be cooled, based on an operational characteristic of the aerial vehicle and/or one or more propellers or propulsion mechanisms, and/or based on temperatures of one or more second components to be cooled, such as a cold food item.

FIG. 1 is a schematic, bottom perspective view diagram of an aerial vehicle 100, according to an implementation. The aerial vehicle 100 may include a body 102, one or more control surfaces 104, one or more motor arms 106, one or more motors 108, and one or more propellers 110. Although a particular configuration of an aerial vehicle 100 is shown in FIG. 1, the temperature management systems as described herein may be used with any other configuration of an aerial vehicle having at least one propeller airflow, propulsion airflow, and/or vehicle airflow, that may be selectively utilized for temperature management of various components of the aerial vehicle.

The body 102 of the aerial vehicle 100 may have any shape, and may be shaped to reduce aerodynamic drag, for example. The body 102 may be formed of any suitable material, such as metal, plastic, carbon fiber, other materials, or combinations thereof. Various components may be housed or contained at least partially within the body 102, including an aerial vehicle control system 120, one or more power supplies 130, a payload 140, as well as one or more other electronic, avionic, operational, navigational, communication, and/or sensory systems or components, controllers, processors, memory, and others, each of which is referred to herein as 150. Although a particular size and shape of the body 102 is shown in FIG. 1, the body 102 may take any other size or shape, e.g., elliptical, circular, hexagonal, octagonal, polygonal, or other aerodynamic shape.

In addition, one or more control surfaces 104 may be connected to or formed as part of the body 102. The control surfaces 104 may be formed of any suitable material, such as metal, plastic, carbon fiber, other materials, or combinations thereof. The control surfaces 104 may include one or more flaps, ailerons, or other control surfaces to control flight characteristics of the aerial vehicle 100, and the control surfaces 104 may be controlled by instructions or signals provided by the aerial vehicle control system 120. Although eight control surfaces 104-1, 104-2, 104-3, 104-4, 104-5, 104-6, 104-7, 104-8 having a particular shape, size, configuration, orientation, and location are shown in FIG. 1, any number, shape, size, configuration, orientation, or combination of control surfaces 104 may be provided at various locations on the aerial vehicle 120.

Further, one or more motor arms 106 may be connected to or formed as part of the body 102. The motor arms 106 may be formed of any suitable material, such as metal, plastic, carbon fiber, other materials, or combinations thereof. The motor arms 106 may have any shape, and may be shaped to reduce aerodynamic drag, for example. Each of the motor arms 106 may support a motor 108 and corresponding propeller 110.

Each of the motors 108 may rotate a corresponding propeller 110 to generate thrust for lifting and/or maneuvering the aerial vehicle 100. The motors 108 may be any suitable type of motor capable of generating, in combination with the corresponding propeller 110, thrust to lift and/or maneuver the aerial vehicle 100 or at least a portion of the aerial vehicle 100.

Each of the propellers 110 may include one or more blades that are rotated by the corresponding motor 108. Each of the blades of the propeller 110 may have a cross-sectional shape in the form of an airfoil to provide thrust to the aerial vehicle 100 during operation. In addition, the blades of the propeller 110 may be formed of any suitable material, such as metal, plastic, carbon fiber, other materials, or combinations thereof.

In the example aerial vehicle 100 shown in FIG. 1, four pairs of motor arms 106-1, 106-2, 106-3, 106-4 are connected to or formed as part of the body 102, and each pair of motor arms includes a motor 108-1, 108-2, 108-3, 108-4 and corresponding propeller 110-1, 110-2, 110-3, 110-4. Although FIG. 1 shows the motor arms 106, motors 108, and propellers 110 connected to or formed as part of the body 102 in a particular configuration and in a vertically downward facing direction from the body 102, other configurations and/or orientations are possible. For example, the motor arms 106, motors 108, and propellers 110 may be coupled to the body 102 in a vertically upward facing direction, or in various combinations of vertically downward facing, vertically upward facing, or other orientations of motor arms, motors, and propellers. In addition, although the aerial vehicle 100 shown in FIG. 1 includes four pairs of motor arms 106, four motors 108, and four propellers 110, any other number, shape, size, configuration, orientation, or combination of motor arms, motors, or propellers at various locations is possible. Further, any other types of propulsion mechanisms may be used in place of or in combination with those shown in FIG. 1, including fans, jets, turbojets, turbo fans, jet engines, electric jets, and the like, and/or combinations thereof.

The aerial vehicle control system 120 may control the operation of various components of the aerial vehicle 100, including the control surfaces 104, the motors 108 and corresponding propellers 110 or other propulsion mechanisms, payload engagement mechanisms that maintain the payload 140, any electronic, avionic, operational, navigational, communication, and/or sensory systems or components, controllers, processors, and other components 150 of the aerial vehicle 100, and/or the heat pipes and/or cool air ducts and pipes as described herein. For example, the aerial vehicle control system 120 may transmit instructions to the motors 108 and corresponding propellers 110 (and/or other propulsion mechanisms), as well as actuators associated with ailerons, flaps, or other control surfaces 104, to control flight and navigation of the aerial vehicle 100, may transmit instructions to monitor components, temperatures, and/or operational characteristics of the aerial vehicle 100, e.g., using electronic, avionic, operational, navigational, communication, and/or sensory systems or components, and/or may transmit instructions to select and/or thermally connect heat pipes, and/or to open or close cool air ducts and/or cool air pipes. While the aerial vehicle control system 120 is shown in FIG. 1 at a particular location on aerial vehicle 100, the aerial vehicle control system 120 may be positioned at various locations on aerial vehicle 100.

In addition, the aerial vehicle control system 120 may communicate (via wired or wireless communication) with one or more other aerial vehicles and/or with an aerial vehicle management system or control station in order to receive and/or transmit data and information. As discussed in further detail with respect to FIG. 9, the aerial vehicle control system 120 may control at least the operation, routing, navigation, and communication of the aerial vehicle 100.

The sensor systems or components (not shown) of the aerial vehicle 100 may include temperature sensors, image capture devices, infrared sensors, thermal sensors, time of flight sensors, radar sensors, LIDAR sensors, accelerometers, altitude sensors, pressure sensors, weather sensors, GPS (Global Positioning System) sensors, and/or other sensors. The data and information received, processed, and/or analyzed by the sensor systems may be used by the aerial vehicle control system 120 to control at least the operation, routing, navigation, and communication of the aerial vehicle 100. For example, the aerial vehicle control system 120 may use the data and information received, processed, and/or analyzed by the sensor systems to monitor components, temperatures, and/or operational characteristics of the aerial vehicle 100, and to control the selection and/or thermal connection of heat pipes, and/or the opening or closing of cool air ducts and/or cool air pipes, based on the data and information.

The one or more power supplies 130 may include a battery, capacitor, or any other electrical energy storage component to provide power to actuators associated with the control surfaces 104, the motors 108 or other propulsion mechanisms, payload engagement mechanisms, any electronic, avionic, operational, navigational, communication, and/or sensory systems or components, controllers, processors, and other components 150 of the aerial vehicle 100, and/or any actuators associated with the heat pipes and/or cool air ducts and pipes as described herein. While two power supplies 130 are shown in FIG. 1 at particular locations on aerial vehicle 100, any number or combination of power supplies 130 may be positioned at various locations on aerial vehicle 100.

The payload 140 may be any suitable item, object, apparatus, or component to be acquired, carried, delivered, and/or released by the aerial vehicle 100. For example, the payload 140 may be an item ordered by a customer to be delivered by the aerial vehicle 100 to a location associated with the customer, or any other location associated with the delivery. The payload 140 may be acquired, carried, and/or released by any suitable payload engagement mechanism of the aerial vehicle 100, including access doors, grasping mechanisms having opening/closing arms or digits, suction mechanisms, electro-adhesion mechanisms, magnetic attachment mechanisms, roller- or conveyor-type mechanisms, and the like. While the payload 140 is shown in FIG. 1 at a particular location on aerial vehicle 100, the payload 140 may be positioned at various locations on aerial vehicle 100.

The one or more electronic, avionic, operational, navigational, communication, and/or sensory systems or components, controllers, processors, memory, and other components 150 collectively refer to any of various components that generate heat during operation of the aerial vehicle 100. For example, the components 150 may include at least the aerial vehicle control system 120, power supplies 130, motors 108, motor controllers, other propulsion mechanisms, power regulation modules, flight control systems, other controllers and/or avionics components, and/or various sensor systems and/or components. In addition, some of the components 150 may be positioned toward a center of the body 102, e.g., power supplies, flight control systems, etc., while others of the components 150 may be positioned toward a periphery of the body 102, e.g., motors, other propulsion mechanisms, sensor systems and/or components, etc. However, although the aerial vehicle 100 shown in FIG. 1 includes a particular number, shape, size, configuration, orientation, and combination of components 150-1, 150-2, 150-3, 150-4, 150-5, 150-6, 150-7, 150-8, 150-9, 150-10, 150-11, 150-12, 150-13, 150-14 at particular locations on the aerial vehicle 100, any other number, shape, size, configuration, orientation, or combination of components 150 at various locations is possible.

Figure 2:
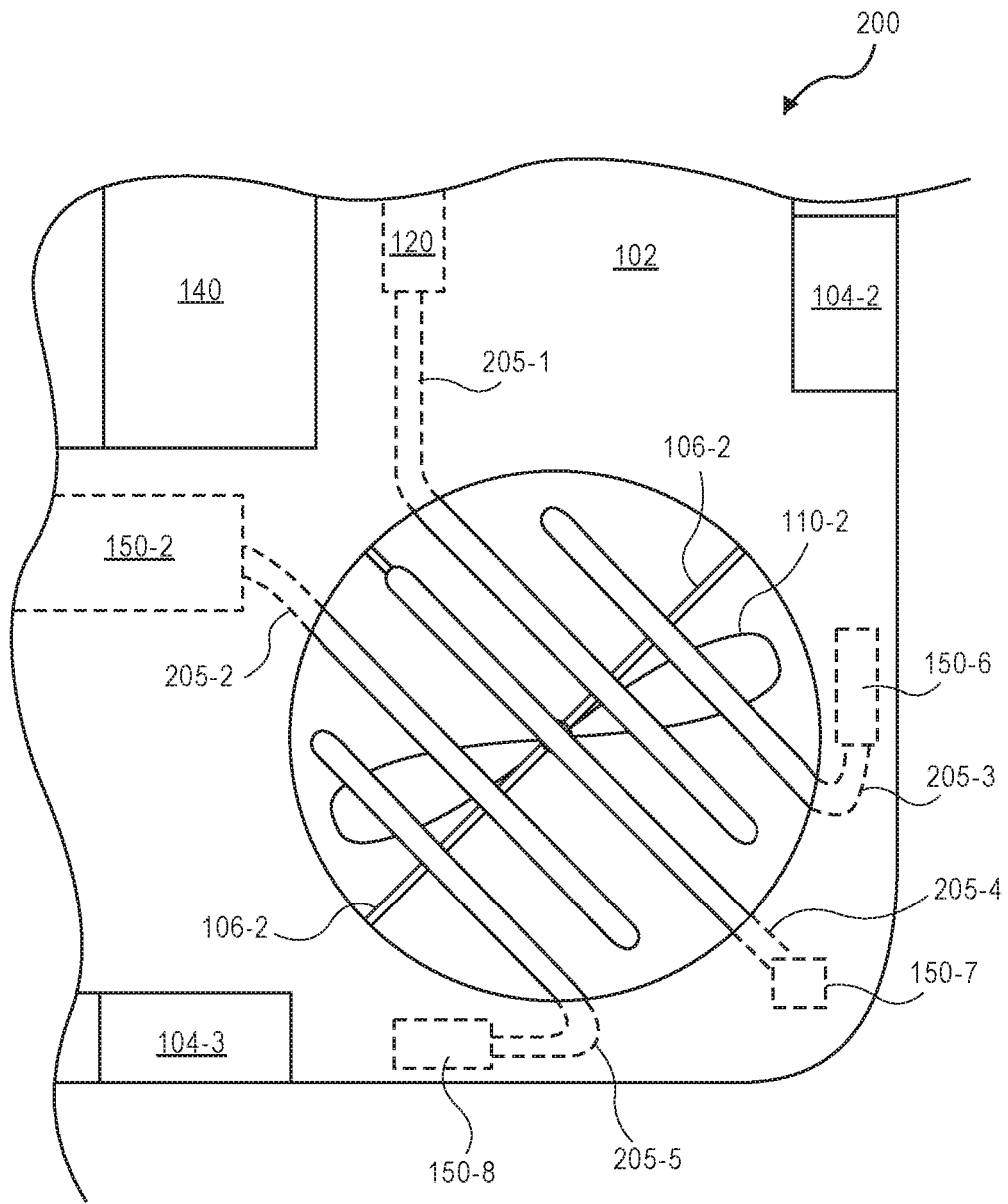
FIG. 2 is a schematic, bottom view diagram of a first heat pipe configuration, according to an implementation.

FIG. 2 is a schematic, bottom view diagram of a first heat pipe configuration 200, according to an implementation. FIG. 2 illustrates a portion of the example aerial vehicle 100 shown in FIG. 1. In this regard, the motor arms 106, motor 108, and propeller 110 shown in FIG. 2 may be any of the respective combination of components shown in FIG. 1, or any similar combination of motor arms, motor, and propeller (or other propulsion mechanism) of an aerial vehicle configured differently than that shown in FIG. 1. For example, the first heat pipe configuration 200 shown in FIG. 2 may be duplicated at other portions of the aerial vehicle 100 not shown in FIG. 2. Alternatively or in addition, any of the heat pipe configurations (or cool air duct configurations) as described herein, or combinations thereof, may be implemented at various portions of the aerial vehicle 100. Moreover, any of the various embodiments described herein may be implemented in various combinations.

FIG. 2 shows the aerial vehicle control system 120 and various components 150-2, 150-6, 150-7, 150-8 that generate heat during operation of the aerial vehicle 100. For example, component 150-2 may be a power supply, a motor controller, other avionic component, or a sensor system. In addition, each of components 150-6, 150-7, 150-8 may be an avionic component or a sensor component.

Each of the aerial vehicle control system 120 and the various components 150 may be connected to a respective heat pipe 205. As shown in FIG. 2, the aerial vehicle control system 120 is connected to heat pipe 205-1, and the various components 150-2, 150-6, 150-7, 150-8 are connected to heat pipes 205-2, 205-3, 205-4, 205-5, respectively. Each of the heat pipes 205 is routed through the body 102 toward a propeller airflow created by propeller 110-2.

In the example embodiment shown in FIG. 2, each of the heat pipes 205 extends at least partially across the propeller airflow created by propeller 110-2 in a substantially linear manner. The heat pipes 205 may be formed of any material that facilitates heat dissipation, as described herein with respect to FIGS. 6A-6C. As a result, heat generated by each of the aerial vehicle control system 120 and the various components 150 may be transferred via the respective heat pipe 205 to the propeller airflow in order to dissipate heat. The combination of the heat pipes 205 may form a grid or screen at least partially across the propeller airflow, thereby also forming at least a partial, protective shroud under and/or around the propeller 110-2.

Each of the heat pipes 205 may have any cross-sectional shape, e.g., elliptical, circular, polygonal, airfoil, or other aerodynamic shape, and the shape of a heat pipe 205 may vary over its length. For example, at the thermal connection between the heat pipe 205 and a component 150 that generates heat, the heat pipe 205 may have a first shape, e.g., an elliptical or polygonal shape, to facilitate heat transfer from the component 150 to the heat pipe 205. As the heat pipe 205 is routed within the body 102 towards a propeller airflow, the heat pipe 205 may have a second shape, e.g., a different elliptical or polygonal shape, e.g., to facilitate efficient routing of the heat pipe 205 through the body 102. Within the propeller airflow, the portion of the heat pipe 205 may have yet a different shape, e.g., an airfoil or other aerodynamic shape, to minimize disruption to the propeller airflow while maximizing heat dissipation by the heat pipe 205 within the propeller airflow.

In some embodiments, the heat pipe 205 may also include one or more heat sinks (not shown) at least within the propeller airflow. For example, the heat sinks may be formed in the shape of fins, ribs, or protrusions on an outer surface of the heat pipe 205. The fins, ribs, or protrusions may have any cross-sectional shape, e.g., elliptical, circular, polygonal, airfoil, or other aerodynamic shape, and may also vary over their length. The heat sinks formed on the outer surface of the heat pipe 205 may increase the surface area available to dissipate heat from the heat pipe 205 within the propeller airflow. In some embodiments, the heat pipe 205 may have an airfoil shape, and the heat sinks formed on the heat pipe 205 may also have an airfoil shape, thereby minimizing disruption to the propeller airflow while increasing the surface area available to dissipate heat.

Although FIG. 2 shows one heat pipe 205 associated with each component that generates heat, in some embodiments, a single heat pipe 205 may be associated with and thermally connected to multiple components that generate heat, thereby consolidating the number of heat pipes 205 that extend at least partially across the propeller airflow. In other embodiments, a single heat pipe 205 associated with one or more components that generate heat may divide into multiple heat pipes 205 that extend at least partially across the propeller airflow, thereby increasing the surface area available to dissipate heat.

In additional embodiments, a single component, e.g., the aerial vehicle control system 120, a power supply 130, or any other component 150 that generates heat, may be associated with and thermally connected to multiple heat pipes 205. Each of the multiple heat pipes 205 may be routed to the same propeller airflow or propulsion airflow, or one or more different propeller airflows or propulsion airflows.

Further, although each of the heat pipes 205 shown in FIG. 2 extends substantially linearly at least partially across the propeller airflow, each of the heat pipes 205 may have any other shape, e.g., curved, angled, or others. In addition, each of the heat pipes 205 may have various lengths that extend completely or only partially across the propeller airflow. Further, two or more of the heat pipes 205 may connect to each other within or near the propeller airflow, e.g., for stability, rigidity, and/or to facilitate heat dissipation.

Furthermore, although FIG. 2 shows a single layer of heat pipes 205 within the propeller airflow situated in a plane substantially parallel to a plane of rotation of the propeller 110-2, multiple layers of heat pipes 205 may extend within the propeller airflow, e.g., layers of heat pipes stacked on top of each other, each layer situated in a plane substantially parallel to a plane of rotation of the propeller 110-2.

Figure 3:
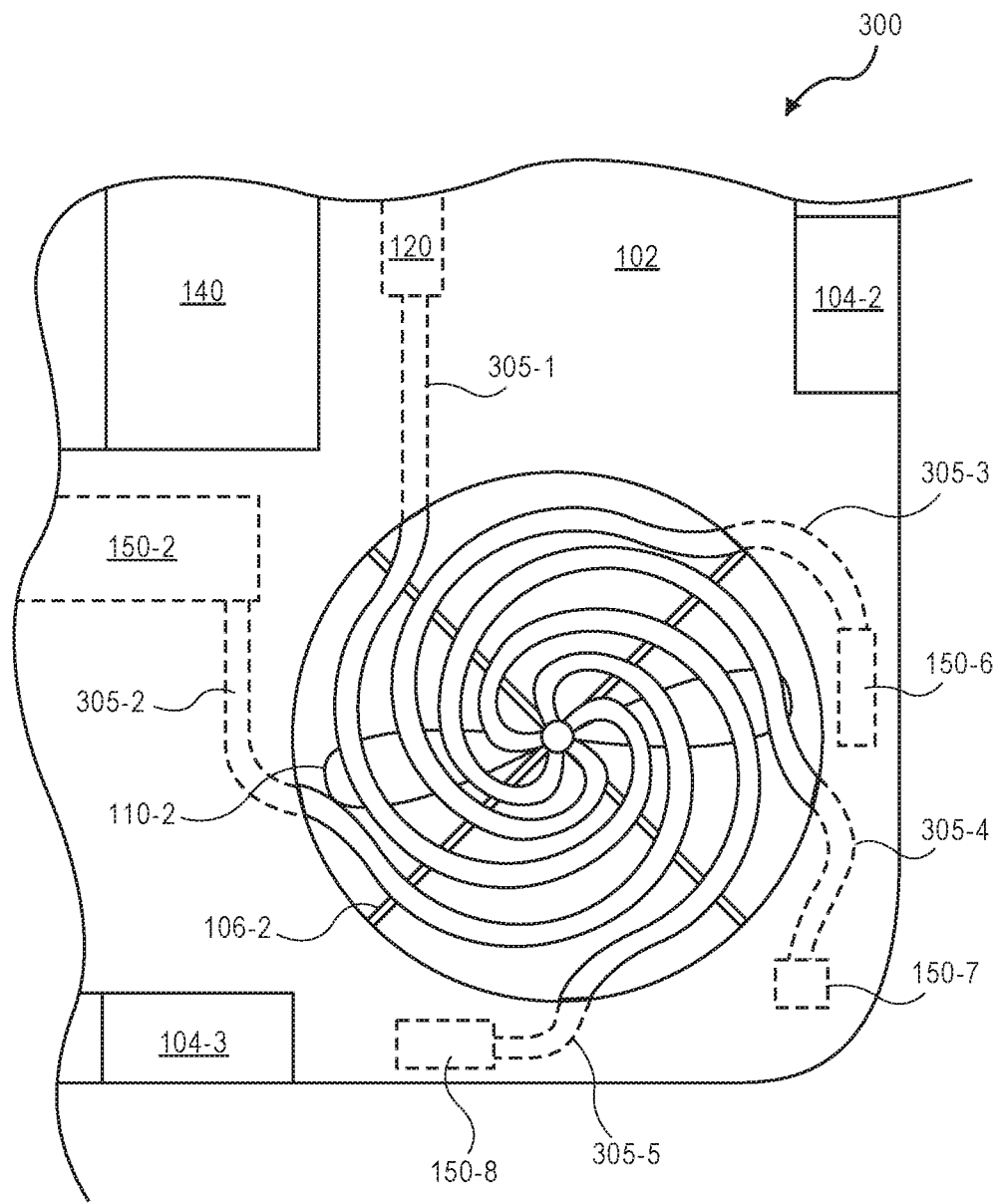
FIG. 3 is a schematic, bottom view diagram of a second heat pipe configuration, according to an implementation.

FIG. 3 is a schematic, bottom view diagram of a second heat pipe configuration 300, according to an implementation. FIG. 3 illustrates a portion of the example aerial vehicle 100 shown in FIG. 1. In this regard, the motor arms 106, motor 108, and propeller 110 shown in FIG. 3 may be any of the respective combination of components shown in FIG. 1, or any similar combination of motor arms, motor, and propeller (or other propulsion mechanism) of an aerial vehicle configured differently than that shown in FIG. 1. For example, the second heat pipe configuration 300 shown in FIG. 3 may be duplicated at other portions of the aerial vehicle 100 not shown in FIG. 3. Alternatively or in addition, any of the heat pipe configurations (or cool air duct configurations) as described herein, or combinations thereof, may be implemented at various portions of the aerial vehicle 100. Moreover, any of the various embodiments described herein may be implemented in various combinations.

Similar to FIG. 2, FIG. 3 shows the aerial vehicle control system 120 and various components 150-2, 150-6, 150-7, 150-8 that generate heat during operation of the aerial vehicle 100. For example, component 150-2 may be a power supply, a motor controller, other avionic component, or a sensor system. In addition, each of components 150-6, 150-7, 150-8 may be an avionic component or a sensor component.

Each of the aerial vehicle control system 120 and the various components 150 may be connected to a respective heat pipe 305. As shown in FIG. 3, the aerial vehicle control system 120 is connected to heat pipe 305-1, and the various components 150-2, 150-6, 150-7, 150-8 are connected to heat pipes 305-2, 305-3, 305-4, 305-5, respectively. Each of the heat pipes 305 is routed through the body 102 toward a propeller airflow created by propeller 110-2.

In the example embodiment shown in FIG. 3, each of the heat pipes 305 extends in an arcuate pattern within the propeller airflow created by propeller 110-2. The heat pipes 305 may be formed of any material that facilitates heat dissipation, as described herein with respect to FIGS. 6A-6C. As a result, heat generated by each of the aerial vehicle control system 120 and the various components 150 may be transferred via the respective heat pipe 305 to the propeller airflow in order to dissipate heat. The combination of the heat pipes 305 may form an arcuate grid or screen pattern at least partially across the propeller airflow, thereby also forming at least a partial, protective shroud under and/or around the propeller 110-2.

As described herein with respect to FIG. 2, each of the heat pipes 305 may have any cross-sectional shape, e.g., elliptical, circular, polygonal, airfoil, or other aerodynamic shape, and the shape of a heat pipe 305 may vary over its length. For example, the heat pipe 305 may have various shapes at the thermal connection between the heat pipe 305 and a component 150 that generates heat and/or as the heat pipe 305 is routed within the body 102 towards a propeller airflow. Within the propeller airflow, the portion of the heat pipe 305 may have a different shape, e.g., an airfoil or other aerodynamic shape, to minimize disruption to the propeller airflow while maximizing heat dissipation by the heat pipe 305 within the propeller airflow.

In some embodiments, the heat pipe 305 may also include one or more heat sinks (not shown) at least within the propeller airflow. For example, the heat sinks may be formed in the shape of fins, ribs, or protrusions on an outer surface of the heat pipe 305. The fins, ribs, or protrusions may have any cross-sectional shape, e.g., elliptical, circular, polygonal, airfoil, or other aerodynamic shape, and may also vary over their length. The heat sinks formed on the outer surface of the heat pipe 305 may increase the surface area available to dissipate heat from the heat pipe 305 within the propeller airflow. In some embodiments, the heat pipe 305 may have an airfoil shape, and the heat sinks formed on the heat pipe 305 may also have an airfoil shape, thereby minimizing disruption to the propeller airflow while increasing the surface area available to dissipate heat.

Further, although FIG. 3 shows one heat pipe 305 associated with each component that generates heat, in some embodiments, a single heat pipe 305 may be associated with and thermally connected to multiple components that generate heat, thereby consolidating the number of heat pipes 305 that extend at least partially across the propeller airflow. In other embodiments, a single heat pipe 305 associated with one or more components that generate heat may divide into multiple heat pipes 305 that extend at least partially across the propeller airflow, thereby increasing the surface area available to dissipate heat.

In additional embodiments, a single component, e.g., the aerial vehicle control system 120, a power supply 130, or any other component 150 that generates heat, may be associated with and thermally connected to multiple heat pipes 305. Each of the multiple heat pipes 305 may be routed to the same propeller airflow or propulsion airflow, or one or more different propeller airflows or propulsion airflows.

Further, although each of the heat pipes 305 shown in FIG. 3 extends in an arcuate pattern within the propeller airflow, each of the heat pipes 305 may have any other shape, e.g., curved, angled, or others. In addition, each of the heat pipes 305 may have various lengths that extend completely or only partially across the propeller airflow. Further, two or more of the heat pipes 305 may connect to each other within or near the propeller airflow, e.g., for stability, rigidity, and/or to facilitate heat dissipation.

Furthermore, although FIG. 3 shows a single layer of heat pipes 305 within the propeller airflow situated in a plane substantially parallel to a plane of rotation of the propeller 110-2, multiple layers of heat pipes 305 may extend in arcuate or other patterns within the propeller airflow, e.g., layers of heat pipes stacked on top of each other, each layer situated in a plane substantially parallel to a plane of rotation of the propeller 110-2.

Figure 4:
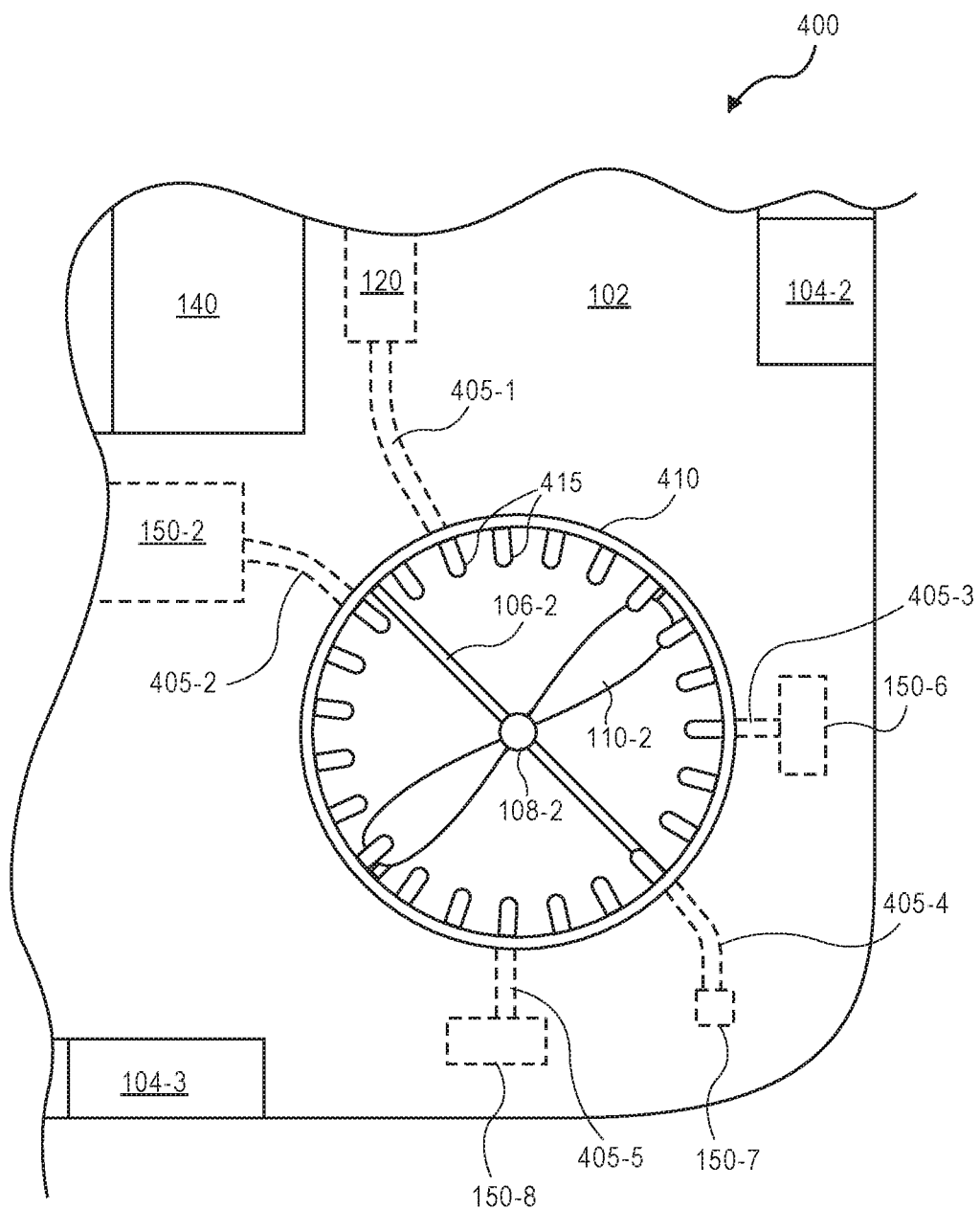
FIG. 4 is a schematic, bottom view diagram of a third heat pipe configuration, according to an implementation.

FIG. 4 is a schematic, bottom view diagram of a third heat pipe configuration 400, according to an implementation. FIG. 4 illustrates a portion of the example aerial vehicle 100 shown in FIG. 1. In this regard, the motor arms 106, motor 108, and propeller 110 shown in FIG. 4 may be any of the respective combination of components shown in FIG. 1, or any similar combination of motor arms, motor, and propeller (or other propulsion mechanism) of an aerial vehicle configured differently than that shown in FIG. 1. For example, the third heat pipe configuration 400 shown in FIG. 4 may be duplicated at other portions of the aerial vehicle 100 not shown in FIG. 4. Alternatively or in addition, any of the heat pipe configurations (or cool air duct configurations) as described herein, or combinations thereof, may be implemented at various portions of the aerial vehicle 100. Moreover, any of the various embodiments described herein may be implemented in various combinations.

Similar to FIGS. 2 and 3, FIG. 4 shows the aerial vehicle control system 120 and various components 150-2, 150-6, 150-7, 150-8 that generate heat during operation of the aerial vehicle 100. For example, component 150-2 may be a power supply, a motor controller, other avionic component, or a sensor system. In addition, each of components 150-6, 150-7, 150-8 may be an avionic component or a sensor component.

Each of the aerial vehicle control system 120 and the various components 150 may be connected to a respective heat pipe 405. As shown in FIG. 4, the aerial vehicle control system 120 is connected to heat pipe 405-1, and the various components 150-2, 150-6, 150-7, 150-8 are connected to heat pipes 405-2, 405-3, 405-4, 405-5, respectively. Each of the heat pipes 405 is routed through the body 102 toward a propeller airflow created by propeller 110-2.

In the example embodiment shown in FIG. 4, each of the heat pipes 405 extends toward and thermally connects to a propeller frame 410 around a periphery of the propeller airflow created by propeller 110-2. The propeller frame 410 may be formed integrally with the body 102 or may be a separate component attached to the body 102. In addition, the propeller frame 410 may also include heat sinks 415 to increase the surface area available to dissipate heat. The heat pipes 405, propeller frame 410, and heat sinks 415 may be formed of any material that facilitates heat dissipation, as described herein with respect to FIGS. 6A-6C. Further, the propeller frame 410 and/or the heat sinks 415 may be formed of solid material, or may be formed with the same external and internal structures as the heat pipes, as described herein with respect to FIGS. 6A-6C. As a result, heat generated by each of the aerial vehicle control system 120 and the various components 150 may be transferred via the respective heat pipe 405 to the propeller airflow in order to dissipate heat. The combination of the heat pipes 405, propeller frame 410, and heat sinks 415 may form a circular screen pattern at least partially around the propeller airflow, thereby also forming at least a partial, protective shroud under and/or around the propeller 110-2.

As described herein with respect to FIGS. 2 and 3, each of the heat pipes 405 may have any cross-sectional shape, e.g., elliptical, circular, polygonal, airfoil, or other aerodynamic shape, and the shape of a heat pipe 405 may vary over its length. For example, the heat pipe 405 may have various shapes at the thermal connection between the heat pipe 405 and a component 150 that generates heat and/or as the heat pipe 405 is routed within the body 102 towards a propeller airflow.

At the periphery of the propeller airflow, the heat pipe 405 may thermally connect with the propeller frame 410, and the propeller frame 410 and/or the heat sinks 415 may have any cross-sectional shape, e.g., elliptical, circular, polygonal, airfoil, or other aerodynamic shape. For example, the heat sinks 415 may extend from the propeller frame 410 toward a center of the propeller airflow, and at least within the propeller airflow, portions of the heat sinks 415 may have an airfoil or other aerodynamic shape to minimize disruption to the propeller airflow while maximizing heat dissipation by the heat sinks 415 within the propeller airflow. In addition, the heat sinks 415 may extend various lengths and with various shapes from the propeller frame 410 toward the center of the propeller airflow.

In some embodiments, the heat sinks 415 may also include one or more fins, ribs, or protrusions on an outer surface of the heat sinks 415. The fins, ribs, or protrusions may have any cross-sectional shape, e.g., elliptical, circular, polygonal, airfoil, or other aerodynamic shape, and may also vary over their length. The fins, ribs, or protrusions formed on the outer surface of the heat sinks 415 may increase the surface area available to dissipate heat from the heat sinks 415 within the propeller airflow. In some embodiments, the heat sinks 415 may have an airfoil shape, and the fins, ribs, or protrusions formed on the heat sinks 415 may also have an airfoil shape, thereby minimizing disruption to the propeller airflow while increasing the surface area available to dissipate heat.

Further, although FIG. 4 shows one heat pipe 405 associated with each component that generates heat, in some embodiments, a single heat pipe 405 may be associated with and thermally connected to multiple components that generate heat, thereby consolidating the number of heat pipes 405 that thermally connect with the propeller frame 410 and heat sinks 415 around the periphery of the propeller airflow. In other embodiments, a single heat pipe 405 associated with one or more components that generate heat may divide into multiple heat pipes 405 that thermally connect with the propeller frame 410 and heat sinks 415 around the periphery of the propeller airflow, thereby more evenly distributing the heat transferred to the propeller frame 410 and heat sinks 415.

In additional embodiments, a single component, e.g., the aerial vehicle control system 120, a power supply 130, or any other component 150 that generates heat, may be associated with and thermally connected to multiple heat pipes 405. Each of the multiple heat pipes 405 may be routed to the same propeller airflow or propulsion airflow, or one or more different propeller airflows or propulsion airflows.

Furthermore, although FIG. 4 shows a single layer of a propeller frame 410 and associated heat sinks 415 around the periphery of the propeller airflow situated in a plane substantially parallel to a plane of rotation of the propeller 110-2, multiple layers of propeller frames 410 and associated heat sinks 415 may extend toward a center of the propeller airflow, e.g., layers of propeller frames and heat sinks stacked on top of each other, each layer situated in a plane substantially parallel to a plane of rotation of the propeller 110-2.

In still further embodiments, one or more of the heat pipes 405 may thermally connect to the propeller 110-2 itself, e.g., directly or via one or more motor arms 106-2 or other structures. In this manner, heat may be transferred from the heat pipes 405 to the propeller 110-2 itself, thereby dissipating heat from the propeller during rotation of the propeller 110-2. For example, in an alternative embodiment to that shown in FIG. 4, heat pipe 405-4 may connect component 150-7 to propeller 110-2 via motor arm 106-2, thereby dissipating heat from the propeller itself during rotation of the propeller 110-2.

Figure 5:
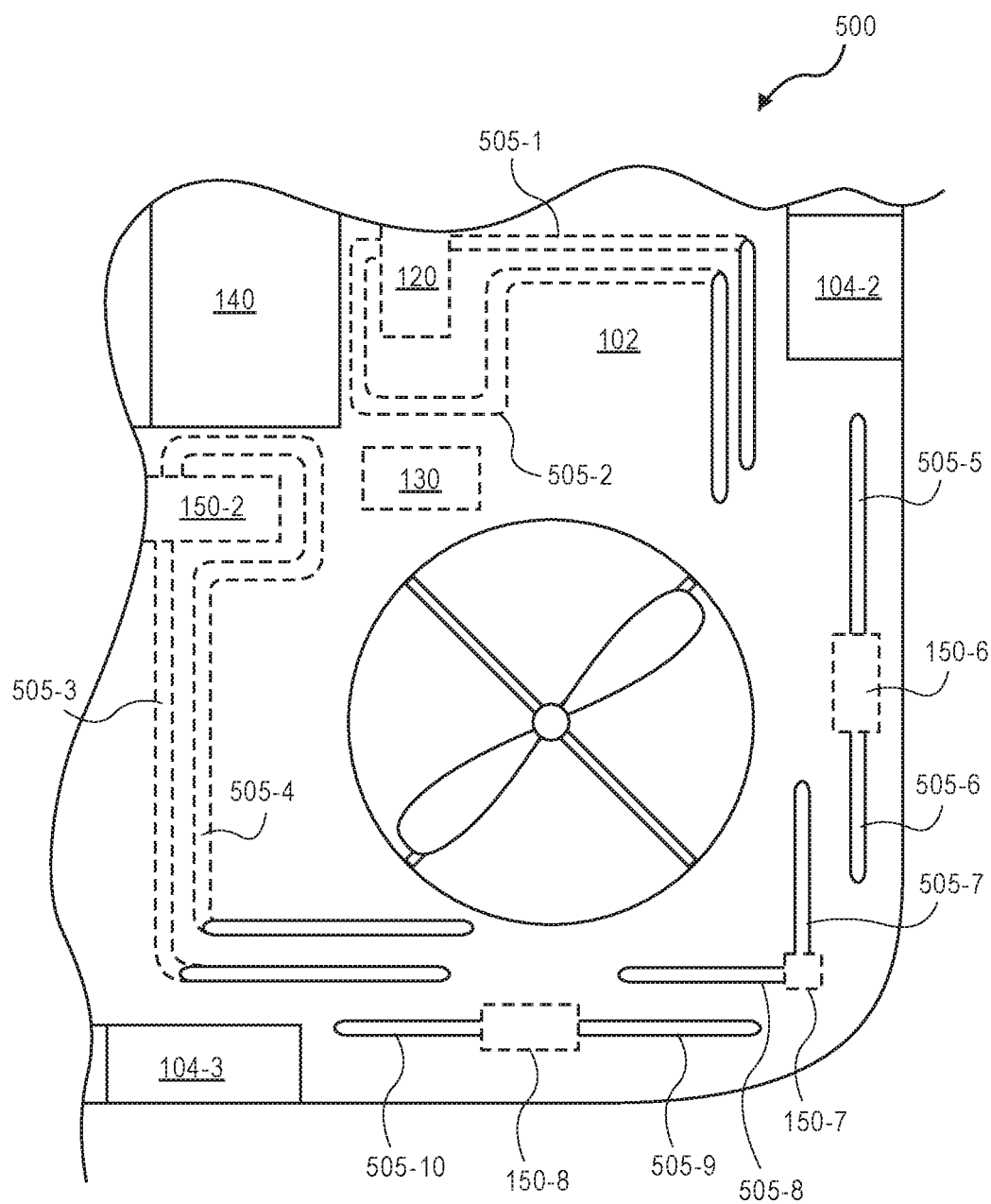
FIG. 5 is a schematic, bottom view diagram of a fourth heat pipe configuration, according to an implementation.

FIG. 5 is a schematic, bottom view diagram of a fourth heat pipe configuration 500, according to an implementation. FIG. 5 illustrates a portion of the example aerial vehicle 100 shown in FIG. 1. In this regard, the motor arms 106, motor 108, and propeller 110 shown in FIG. 5 may be any of the respective combination of components shown in FIG. 1, or any similar combination of motor arms, motor, and propeller (or other propulsion mechanism) of an aerial vehicle configured differently than that shown in FIG. 1. For example, the fourth heat pipe configuration 500 shown in FIG. 5 may be duplicated at other portions of the aerial vehicle 100 not shown in FIG. 5. Alternatively or in addition, any of the heat pipe configurations (or cool air duct configurations) as described herein, or combinations thereof, may be implemented at various portions of the aerial vehicle 100. Moreover, any of the various embodiments described herein may be implemented in various combinations.

Similar to FIGS. 2-4, FIG. 5 shows the aerial vehicle control system 120 and various components 150-2, 150-6, 150-7, 150-8 that generate heat during operation of the aerial vehicle 100. For example, component 150-2 may be a power supply, a motor controller, other avionic component, or a sensor system. In addition, each of components 150-6, 150-7, 150-8 may be an avionic component or a sensor component.

Each of the aerial vehicle control system 120 and the various components 150 may be connected to one or more respective heat pipes 505. As shown in FIG. 5, the aerial vehicle control system 120 is connected to heat pipes 505-1, 505-2, and the various components 150-2, 150-6, 150-7, 150-8 are connected to heat pipes 505-3, 505-4, 505-5, 505-6, 505-7, 505-8, 505-9, 505-10, respectively. Each of the heat pipes 505 is routed through the body 102 toward a portion, region, or surface of the aerial vehicle 100 that experiences a vehicle airflow.

In the example embodiment shown in FIG. 5, each of the heat pipes 505 extends from a respective component toward one or more portions, regions, or surfaces of the aerial vehicle 100 that experience a vehicle airflow. The heat pipes 505 may be formed of any material that facilitates heat dissipation, as described herein with respect to FIGS. 6A-6C. As a result, heat generated by each of the aerial vehicle control system 120 and the various components 150 may be transferred via the respective heat pipes 505 to the vehicle airflow in order to dissipate heat.

As described herein with respect to FIGS. 2-4, each of the heat pipes 505 may have any cross-sectional shape, e.g., elliptical, circular, polygonal, airfoil, or other aerodynamic shape, and the shape of a heat pipe 505 may vary over its length. For example, the heat pipe 505 may have various shapes at the thermal connection between the heat pipe 505 and a component 150 that generates heat and/or as the heat pipe 505 is routed within the body 102 towards a vehicle airflow. Within the vehicle airflow, the portion of the heat pipe 505 may have a different shape, e.g., an airfoil or other aerodynamic shape, to minimize disruption to the vehicle airflow while maximizing heat dissipation by the heat pipe 505 within the vehicle airflow.

In some embodiments, the heat pipe 505 may also include one or more heat sinks (not shown) at least within the vehicle airflow. For example, the heat sinks may be formed in the shape of fins, ribs, or protrusions on an outer surface of the heat pipe 505. The fins, ribs, or protrusions may have any cross-sectional shape, e.g., elliptical, circular, polygonal, airfoil, or other aerodynamic shape, and may also vary over their length. The heat sinks formed on the outer surface of the heat pipe 505 may increase the surface area available to dissipate heat from the heat pipe 505 within the vehicle airflow. In some embodiments, the heat pipe 505 may have a partial airfoil shape, and the heat sinks formed on the heat pipe 505 may also have a partial airfoil shape, thereby minimizing disruption to the vehicle airflow while increasing the surface area available to dissipate heat.

Further, although FIG. 5 shows two heat pipes 505 associated with each component that generates heat, in some embodiments, a single heat pipe 505 may be associated with and thermally connected to multiple components that generate heat, thereby consolidating the number of heat pipes 505 that are routed to one or more portions, regions, or surfaces that experience the vehicle airflow. In other embodiments, a single heat pipe 505 associated with one or more components that generate heat may divide into multiple heat pipes 505 that are routed to one or more portions, regions, or surfaces that experience the vehicle airflow, thereby increasing the surface area available to dissipate heat.

In additional embodiments, a single component, e.g., the aerial vehicle control system 120, a power supply 130, or any other component 150 that generates heat, may be associated with and thermally connected to multiple heat pipes 505. Each of the multiple heat pipes 505 may be routed to the same vehicle airflow, or one or more different vehicle airflows.

Further, although each of the heat pipes 505 shown in FIG. 5 extends substantially linearly within or across the vehicle airflow, each of the heat pipes 505 may have any other shape, e.g., curved, angled, or others. In addition, each of the heat pipes 505 may have various lengths, thicknesses, or other dimensions that extend within or across the vehicle airflow. Further, two or more of the heat pipes 505 may connect to each other within or across the vehicle airflow, e.g., for stability, rigidity, and/or to facilitate heat dissipation.

Moreover, with respect to any of the embodiments described herein with respect to FIGS. 2-5, any single component that generates heat may be associated with multiple heat pipes 205, 305, 405, 505, and each of the multiple heat pipes 205, 305, 405, 505 may be routed differently within the body 102 in order to provide, or apply, heat to one or more second components that may be heated. For example, as shown in FIGS. 2-5, the one or more second components may include one or more control surfaces 104-2, 104-3, the motor 108-2, the propeller 110-2, the payload 140, the payload engagement mechanisms, the power supplies 130, or any other components of the aerial vehicle 100 may benefit from application of heat in order to operate within a particular operating temperature range. Accordingly, one or more of the heat pipes 205, 305, 405, 505 may be routed to, through, or near such components in order to apply heat to those components. Thus, although the heat pipes 205, 305, 405, 505 are generally shown in FIGS. 2-5 as being routed directly toward a propeller airflow, a propulsion airflow, and/or a vehicle airflow, any other routing of the heat pipes 205, 305, 405, 505 is possible in order to selectively apply heat to one or more second components as needed or desired. For example, heat pipes 505-2 and 505-4 are shown in FIG. 5 as being routed near a power supply 130 and the payload 140 in order to selectively apply heat to the power supply 130, the payload 140 and/or the payload engagement mechanisms. In addition, heat pipes 505-1, 505-3, 505-5, 505-10 are shown in FIG. 5 as being routed near control surfaces 140-2, 140-3 in order to selectively apply heat to those control surfaces.

Further, with respect to any of the embodiments described herein with respect to FIGS. 2-5, the heat pipes 205, 305, 405, 505 may be permanently or fixedly attached and thermally connected to respective components that generate heat. In addition or alternatively, the heat pipes 205, 305, 405, 505 may be selectively attached and thermally connected to their respective components, e.g., using actuators. For example, a thermally conductive component, extension, rod, and/or clamp may be moved or actuated to create a thermal connection between a component that generates heat and a selected heat pipe. The actuators may include motors, piezo motors, servos, solenoids, linear actuators, or any other types of actuators. With the use of actuators that selectively thermally connect a heat pipe to a component that generates heat, the dissipation of heat may be more accurately and precisely controlled. For example, a heat pipe may not be thermally connected to a component that generates heat until a measured temperature of the component reaches a determined threshold. In this regard, the temperature of the component may be measured using temperature sensors, thermal sensors, thermal imaging sensors, or any other similar sensors.

In addition, for a component that may be selectively thermally connected to multiple heat pipes, the use of actuators to selectively thermally connect one or more of the multiple heat pipes to the component that generates heat may allow the selection of one or more heat pipes for thermal connection based on various factors. For example, in addition to a measured temperature of the component as described herein, one or more heat pipes may be selected based on an operational characteristic of the aerial vehicle and/or one or more propellers or propulsion mechanisms, such that a heat pipe with a particular routing may be selected that will experience the most or requisite volume or volume flow rate of propeller airflow, propulsion airflow, and/or vehicle airflow.

For example, with respect to the embodiments of FIGS. 2-4, an operational characteristic may relate to an operational status of one or more of the propellers 110. If the propeller 110-2 is not currently operational, a heat pipe associated with a component that generates heat, e.g., aerial vehicle control system 120 or other component 150, may be selected that is routed to a different propeller 110 of the aerial vehicle 100 that is currently operational. In addition, with respect to the embodiment of FIG. 5, an operational characteristic may relate to a flight direction of the aerial vehicle 100. Dependent on the flight direction, a heat pipe, e.g., heat pipe 505-7 or heat pipe 505-8, associated with a component that generates heat, e.g., component 150-7, may be selected that is routed to a portion, region, or surface of the aerial vehicle that experiences a vehicle airflow.

Further, one or more heat pipes may be selected based on one or more second components that are to be heated based on their respective measured temperatures, such that a heat pipe with a particular routing may be selected that will apply heat to one or more second components. In this regard, the temperatures of the one or more second components may be measured using temperature sensors, thermal sensors, thermal imaging sensors, or any other similar sensors.

FIGS. 6A-6C are schematic, perspective view diagrams of example heat pipes 600-1, 600-2, 600-3, according to implementations. Heat pipes 605 are generally closed systems that comprise a sealed pipe or tube 607. The pipe or tube 607 may be formed of a thermally conductive material, e.g., copper, aluminum, stainless steel, or other materials. Within the sealed pipe or tube 607 is a material 609 that transitions between a gas phase and a liquid phase due to evaporation at a hot end of the pipe and condensation at a cold end of the pipe. The material 609 within the sealed pipe or tube may be any suitable material, e.g., water, alcohol, ammonia, nitrogen, oxygen, neon, hydrogen, helium, or other materials, that will undergo the transitions between gas and liquid phases in an intended operating temperature range of the heat pipe. Further, the inner surface of the pipe or tube 607 may include a wick 608 or other similar structure that facilitates capillary action of the liquid phase of the material 609 within the sealed pipe or tube 607. For example, the wick 608 may include grooves or other similar structures running parallel to an axis of the pipe or tube 607 that facilitate movement of the liquid phase of the material 609 along the pipe or tube 607.

In addition, heat pipes 605 may also include an evaporator at a higher temperature end or portion of the pipe or tube 607 and/or a condenser at a lower temperature end or portion of the pipe or tube 607. The evaporator may be a thermally conductive material that provides a thermal connection between the component that generates heat and the pipe or tube 607. In addition, the condenser may also be a thermally conductive material that is situated adjacent or within a propeller airflow or vehicle airflow and may provide an increased surface area, e.g., similar to a heat sink, to dissipate heat. Each of the evaporator and the condenser may be soldered, clamped, or otherwise connected to an appropriate end or portion of the pipe or tube 607.

In operation, when a first end of a heat pipe 605 is heated by a source external to the heat pipe 605, heat is transferred via the pipe or tube 607 to the material 609 that is in a liquid phase at the first end and causes evaporation of the material 609 at the first end into a gas phase. The evaporated material 609 moves, at least partially due to the increased pressure at the first end, from the first end of the heat pipe 605 to a second end of the heat pipe 605, which is generally colder than the first end. At the second end of the heat pipe 605, heat is released from the material 609 that is in a gas phase at the second end and causes condensation of the material 609 into a liquid phase, thereby transferring heat via the pipe or tube 607 to an environment external to the heat pipe 605. The material 609 in the liquid phase then returns to the first end of the heat pipe 605 via capillary action along the wick 608, and the process repeats.

FIG. 6A shows a heat pipe 600-1 that includes an elliptical or circular cross-section. In addition, the heat pipe 605 includes a sealed pipe or tube 607 having a wick 608 on an inner surface thereof, and a material 609 that transitions between gas and liquid phases and moves within the sealed pipe or tube 607.

FIG. 6B shows a heat pipe 600-2 that includes an airfoil cross-section. In addition, the heat pipe 605 includes a sealed pipe or tube 607 having a wick 608 on an inner surface thereof, and a material 609 that transitions between gas and liquid phases and moves within the sealed pipe or tube 607. The heat pipe 605 of FIG. 6B further includes two heat sinks 610-1, 610-2 on an outer surface of the sealed pipe or tube 607. The heat sinks 610 may increase the surface area available to transfer heat via the heat pipe 605. For example, the heat pipe 600-2 shown in FIG. 6B may be used in the embodiments shown in FIGS. 2-4, as part of the heat pipes 205, 305, 405, propeller frame 410, and/or heat sinks 415 that are positioned within or near a propeller or propulsion airflow. Although two heat sinks 610-1, 610-2 are shown in FIG. 6B, any number, shape, size, configuration, or orientation of heat sinks may be provided on the outer surface, or portions of the outer surface, of the sealed pipe or tube 607.

FIG. 6C shows a heat pipe 600-3 that includes a half airfoil cross-section. In addition, the heat pipe 605 includes a sealed pipe or tube having a wick (not shown) on an inner surface thereof, and a material (not shown) that transitions between gas and liquid phases and moves within the sealed pipe or tube. The heat pipe 605 of FIG. 6C further includes two heat sinks 610-1, 610-2 on an outer surface of the sealed pipe or tube. The heat sinks 610 may increase the surface area available to transfer heat via the heat pipe 605. For example, the heat pipe 600-3 shown in FIG. 6C may be used in the embodiments shown in FIG. 5, as part of the heat pipes 505 that are positioned within or across a vehicle airflow. Although two heat sinks 610-1, 610-2 are shown in FIG. 6C, any number, shape, size, configuration, or orientation of heat sinks may be provided on the outer surface, or portions of the outer surface, of the sealed pipe or tube.

Further, although heat pipes 600-1, 600-2, 600-3 are shown with particular shapes, sizes, configurations, and orientations in FIGS. 6A-6C, the heat pipes as described herein may be formed with any other shapes, sizes, configurations, and orientations, or combinations thereof, which may vary along the length of the heat pipes.

Figure 7A:
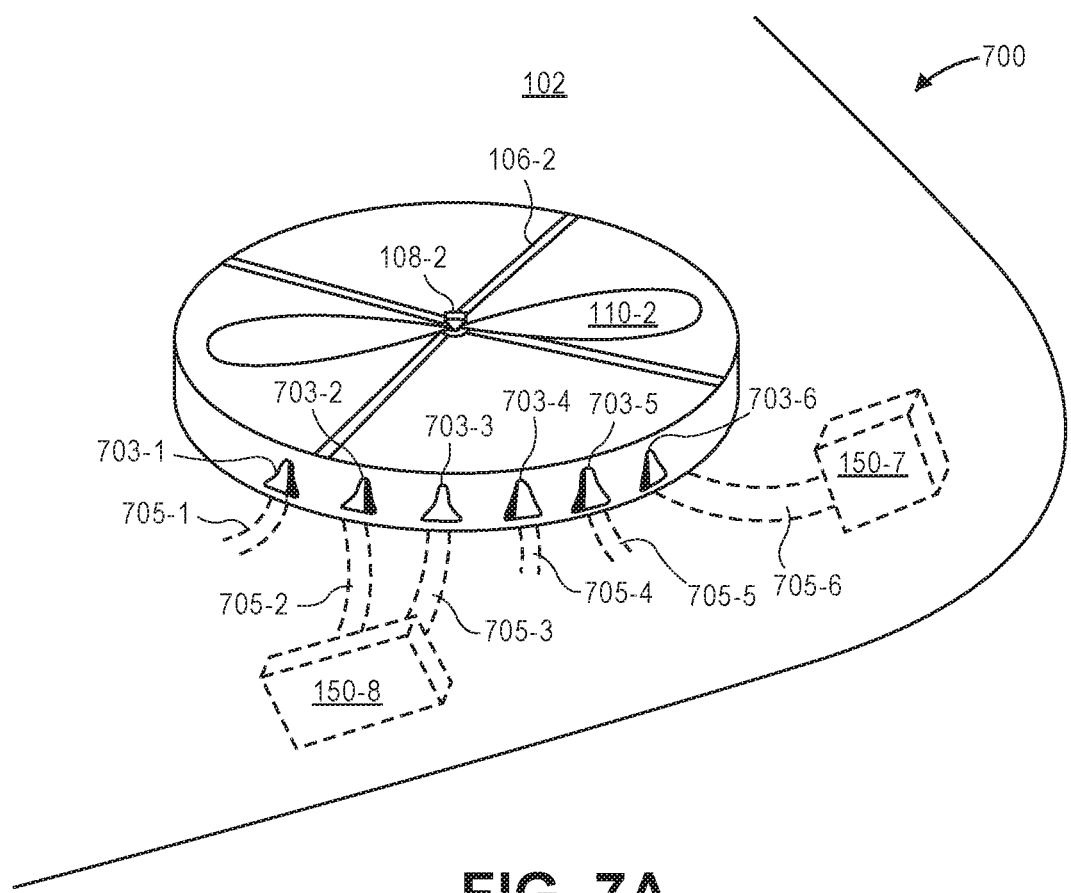
FIG. 7A is a schematic, bottom perspective view diagram of a cool air duct configuration, according to an implementation.
Figure 7B:
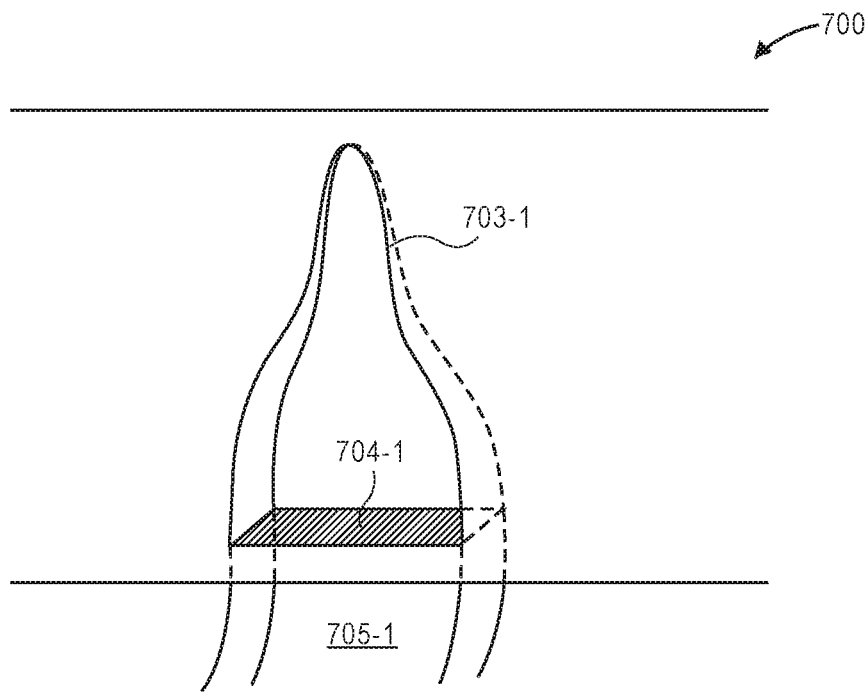
FIG. 7B is a schematic, perspective view diagram of an example cool air duct, according to an implementation.

FIG. 7A is a schematic, bottom perspective view diagram of a cool air duct configuration 700, according to an implementation, and FIG. 7B is a schematic, perspective view diagram of an example cool air duct 703, according to an implementation. FIG. 7A illustrates a portion of the example aerial vehicle 100 shown in FIG. 1. In this regard, the motor arms 106, motor 108, and propeller 110 shown in FIG. 7A may be any of the respective combination of components shown in FIG. 1, or any similar combination of motor arms, motor, and propeller (or other propulsion mechanism) of an aerial vehicle configured differently than that shown in FIG. 1. For example, the cool air duct configuration 700 shown in FIG. 7A may be duplicated at other portions of the aerial vehicle 100 not shown in FIG. 7A. Alternatively or in addition, any of the heat pipe configurations (or cool air duct configurations) as described herein, or combinations thereof, may be implemented at various portions of the aerial vehicle 100. Moreover, any of the various embodiments described herein may be implemented in various combinations.

Similar to FIGS. 2-5, FIG. 7A shows various components 150-7, 150-8 that generate heat during operation of the aerial vehicle 100. For example, each of components 150-7, 150-8 may be an avionic component or a sensor component.

Each of the various components 150 may be connected to a respective cool air pipe 705. As shown in FIG. 7A, the various components 150-7, 150-8 are connected to cool air pipes 705-2, 705-3, 705-6. Each of the cool air pipes 705 is routed through the body 102 from one or more cool air ducts 703 around a periphery of a propeller airflow created by propeller 110-2.

In the example embodiment shown in FIG. 7A, the cool air ducts 703 are arranged around a periphery of the propeller airflow created by propeller 110-2. The cool air ducts 703 and cool air pipes 705 may be formed of any material, e.g., metal, plastic, carbon fiber, other materials, or combinations thereof, that facilitates routing of an airflow, as described herein. Each of the cool air ducts 703 may have any shape that permits the entry of at least a portion of the propeller airflow. For example, as shown in FIG. 7B, the cool air duct 703-1 may be formed in the shape of a NACA (National Advisory Committee for Aeronautics) duct with arcuate or curved sidewalls that lead to an opening 704-1 to a cool air pipe 705-1 that routes the airflow to one or more components 150 that generate heat. Alternatively, the cool air ducts 703 may be formed in any other shape, e.g., elliptical, circular, rectangular, polygonal, or other aerodynamic shape.

Each of the cool air pipes 705 may have any cross-sectional shape, e.g., elliptical, circular, polygonal, airfoil, or other aerodynamic shape, and the shape of a cool air pipe 705 may vary over its length. For example, the cool air pipe 705 may have various shapes at a connection with the cool air duct 703 around a periphery of a propeller airflow, as the cool air pipe 705 is routed within the body 102, and/or at a connection with or opening/outlet near a component 150 that generates heat.

Further, in some embodiments, a single cool air duct 703 and cool air pipe 705 may be associated with multiple components that generate heat, thereby consolidating the number of cool air ducts 703 and cool air pipes 705 that are arranged around a periphery of the propeller airflow. In other embodiments, multiple cool air ducts 703 and cool air pipes 705 may be associated with a single component that generates heat to increase the airflow that is routed to the component from the propeller airflow.

In additional embodiments, a single component, e.g., the aerial vehicle control system 120, a power supply 130, or any other component 150 that generates heat, may be associated with multiple cool air ducts 703 and cool air pipes 705. Each of the multiple cool air ducts 703 and cool air pipes 705 may be routed from the same propeller airflow or propulsion airflow, or one or more different propeller airflows or propulsion airflows.

Further, although each of the cool air ducts 703 and cool air pipes 705 shown in FIG. 7A are shown arranged around a periphery of a propeller airflow, the cool air ducts 703 and cool air pipes 705 may also be arranged at portions, regions, or surfaces of the aerial vehicle 100 that experience a vehicle airflow, e.g., toward an exposed portion of the aerial vehicle or a forward flight direction of the aerial vehicle 100.

Furthermore, although FIG. 7A shows a single layer of cool air ducts 703 arranged around the periphery of the propeller airflow and situated in a plane substantially parallel to a plane of rotation of the propeller 110-2, multiple layers of cool air ducts 703 may be arranged around the periphery of the propeller airflow, e.g., layers of cool air ducts stacked on top of each other, each layer situated in a plane substantially parallel to a plane of rotation of the propeller 110-2. In addition, although a particular number, size, shape, configuration, and orientation of cool air ducts 703 and cool air pipes 705 is shown in FIG. 7A, any number, size, shape, configuration, or orientation of cool air ducts 703 and cool air pipes 705 may be provided around the periphery of the propeller airflow.

Moreover, with respect to any of the embodiments described herein with respect to FIG. 7A, one or more second components that may be cooled may be associated with one or more cool air pipes 705. For example, as shown in FIGS. 2-5 and 7A, the one or more second components may include the payload 140 or any other components of the aerial vehicle 100 that may benefit from airflow in order to maintain or operate within a particular temperature range. Accordingly, the cool air pipes 705 may be routed to, through, or near such components in order to provide airflow to those components. For example, the cool air pipes 705 may provide airflow to a payload 140 that may be maintained at a particular temperature, e.g., a cold food item.

Further, with respect to any of the embodiments described herein with respect to FIGS. 2-5 and 7A, the cool air pipes 705 may be permanently or fixedly attached to or near respective components that generate heat. In addition or alternatively, the cool air pipes 705 may be selectively attached to or near their respective components, e.g., using actuators. The actuators may include servos, solenoids, linear actuators, or any other types of actuators. Further, one or more portions of the cool air pipes 705 may include valves to selectively route the airflow to particular components, and/or the cool air ducts 703 or the openings 704 may also include valves or other structures to selectively open or close the cool air ducts 703 or the openings 704. For example, when the cool airflow is not needed or desired at one or more components, one or more of the cool air ducts 703 may also be covered, e.g., by thin material sheets or shields, in order to prevent entry of airflow and in order to make the inner surface of the periphery of the propeller substantially smooth to minimize disruption to the airflow.

With the use of actuators, valves, or other structures that selectively route airflow to a component that generates heat, the dissipation of heat may be more accurately and precisely controlled. For example, airflow may not be routed via a cool air duct and cool air pipe to a component that generates heat until a measured temperature of the component reaches a determined threshold. In this regard, the temperature of the component may be measured using temperature sensors, thermal sensors, thermal imaging sensors, or any other similar sensors.

In addition, for a component that may be selectively connected to multiple cool air pipes and cool air ducts, the use of actuators, valves, or other structures to selectively route airflow via one or more of the multiple cool air pipes and cool air ducts to the component that generates heat may allow the selection of one or more cool air pipes and cool air ducts for connection based on various factors. For example, in addition to a measured temperature of the component as described herein, one or more cool air pipes and cool air ducts may be selected based on an operational characteristic of the aerial vehicle and/or one or more propellers or propulsion mechanisms, such that a cool air pipe and cool air duct with a particular routing may be selected that will experience the most or requisite volume or volume flow rate of propeller airflow, propulsion airflow, and/or vehicle airflow.

For example, with respect to the embodiments of FIGS. 2-4 and 7A, an operational characteristic may relate to an operational status of one or more of the propellers 110. If the propeller 110-2 is not currently operational, a cool air pipe and cool air duct associated with a component that generates heat, e.g., aerial vehicle control system 120 or other component 150, may be selected that is routed from a different propeller 110 of the aerial vehicle 100 that is currently operational. In addition, with respect to the embodiments of FIGS. 5 and 7A, an operational characteristic may relate to a flight direction of the aerial vehicle 100. Dependent on the flight direction, a cool air pipe and cool air duct associated with a component that generates heat may be selected that is routed from a portion, region, or surface of the aerial vehicle that experiences a vehicle airflow.

Further, one or more cool air pipes and cool air ducts may be selected based on one or more second components that are to be cooled based on their respective measured temperatures, such that a cool air pipe and cool air duct with a particular routing may be selected that will provide airflow to one or more second components. In this regard, the temperatures of the one or more second components may be measured using temperature sensors, thermal sensors, thermal imaging sensors, or any other similar sensors.

Figure 8:
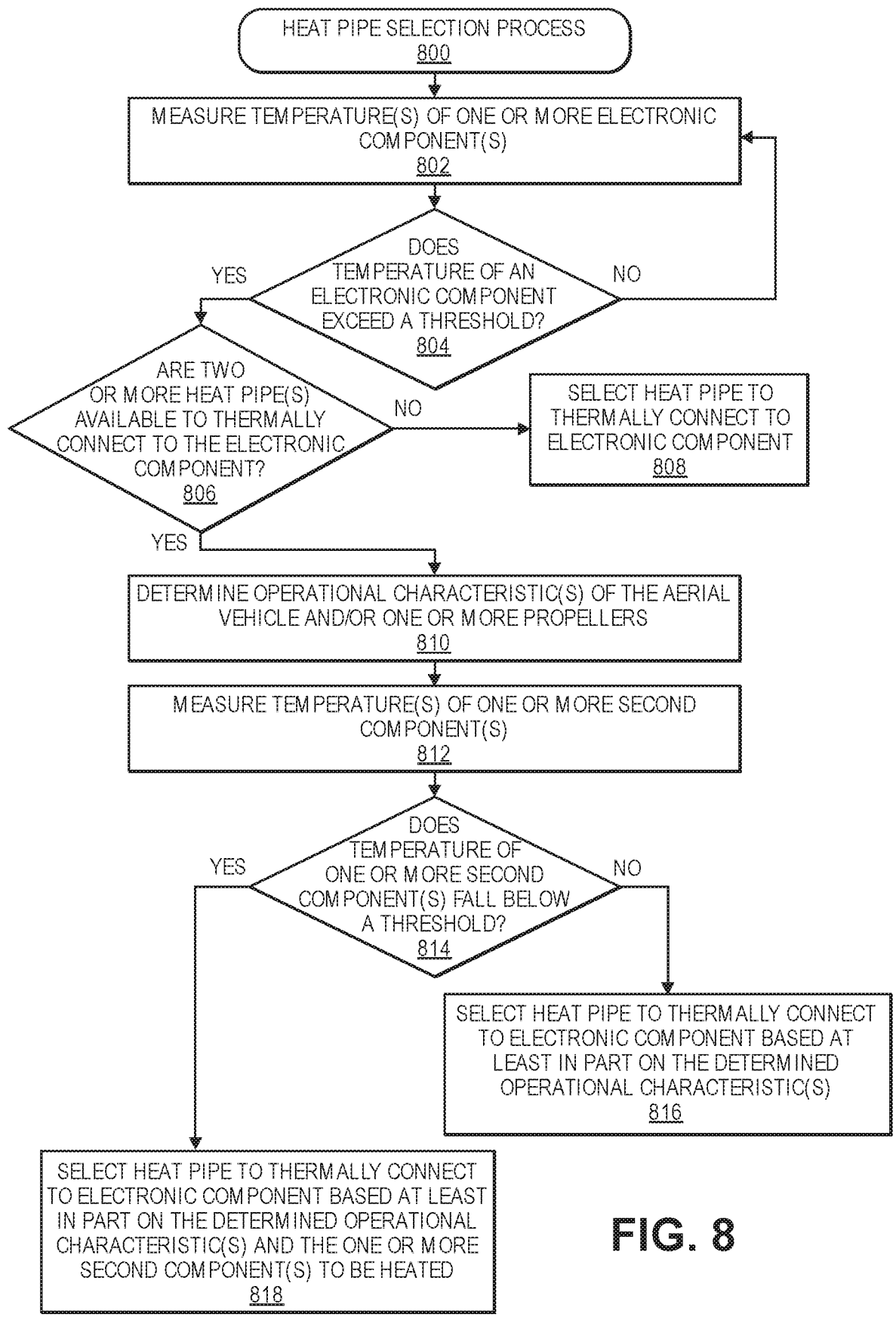
FIG. 8 is a flow diagram illustrating an example heat pipe selection process, according to an implementation.

FIG. 8 is a flow diagram illustrating an example heat pipe selection process 800, according to an implementation. The process 800 begins by measuring the temperatures of one or more electronic components that generate heat, as in 802. As described herein, the temperatures of the one or more electronic components may be measured using temperature sensors, thermal sensors, thermal imaging sensors, or any other similar sensors. Then, the process 800 may determine whether the measured temperature of an electronic component exceeds a respective threshold, as in 804. The threshold may be based on a desired operating temperature range of the electronic component, e.g., a maximum operating temperature, or may be based on any other factors. If the measured temperature of the electronic component does not exceed the respective threshold, then the process 800 may return to 802 to continue to monitor the temperatures of the one or more electronic components.

If, however, the measured temperature of the electronic component does exceed the respective threshold, then the process 800 may proceed to determine whether two or more heat pipes are available for thermal connection to the electronic component, as in 806. If only one heat pipe is available for thermal connection to the electronic component, then the process 800 proceeds to select the available heat pipe for thermal connection to the electronic component, as in 808, and the process may end. For example, the selected heat pipe may be routed to a propeller airflow, a propulsion airflow, and/or a vehicle airflow.

Alternatively, two or more heat pipes, e.g., that are routed to different propeller or propulsion airflows or different vehicle airflows, or that are routed differently within the aerial vehicle and/or near one or more second components that may be heated, may be available for thermal connection to the electronic component. If two or more heat pipes are available for thermal connection, then the process 800 may proceed to determine operational characteristics of the aerial vehicle and/or one or more propellers or propulsion mechanisms, as in 810. For example, the operational characteristics of the aerial vehicle may include a flight direction, a flight speed, a measured or detected wind speed and/or direction, a measured external or environmental temperature, or other factors related to operation of the aerial vehicle. In addition, the operational characteristics of the one or more propellers or propulsion mechanisms may include an operational status, a rotational speed, a rotational direction, an amount of generated thrust, an operating temperature, or other factors related to operation of the one or more propellers or propulsion mechanisms.

Then, the temperatures of one or more second components that may benefit from the application of heat may be measured, as in 812. As described herein, the temperatures of the one or more second components may be measured using temperature sensors, thermal sensors, thermal imaging sensors, or any other similar sensors. In some embodiments, a second component, e.g., a payload, may be identified based on an identifier, e.g., a barcode, an alphanumeric identifier, a radiofrequency identification tag or chip, or any other identifier, on the payload, e.g. using an imaging sensor, a scanner, a radiofrequency identification reader, or other similar sensor. Then, a desired temperature range and/or respective temperature threshold for the second component may be determined based on the identification of the second component, e.g., with reference to a database having information associated with the identified second component. The process 800 then determines whether the temperature of a second component falls below a respective threshold, as in 814. The threshold may be based on a desired operating temperature range of the second component, e.g., a minimum operating temperature, or may be based on any other factors.

If the temperatures of the one or more second components do not fall below respective thresholds, or if there are no second components whose temperatures are measured and/or to which heat may be selectively routed, the process 800 may proceed to select a heat pipe for thermal connection to the electronic component based at least in part on the determined operational characteristics, as in 816. For example, the selected heat pipe may be routed to a propeller airflow, a propulsion airflow, and/or a vehicle airflow based on the operational characteristics of the aerial vehicle and/or the one or more propellers or propulsion mechanisms.

If, however, the temperatures of the one or more second components do fall below respective thresholds, the process 800 may proceed to select a heat pipe for thermal connection to the electronic component based at least in part on the determined operational characteristics and the one or more second components to be heated, as in 818. For example, the selected heat pipe may be routed to, through, or near the one or more second components and then to a propeller airflow, a propulsion airflow, and/or a vehicle airflow based on the operational characteristics of the aerial vehicle and/or the one or more propellers or propulsion mechanisms and based on the one or more second components that may be heated.

The process 800 described herein with respect to FIG. 8 may be repeated as needed or desired, e.g., continuously or intermittently during operation of the aerial vehicle, or at any other interval or frequency. In addition, the operational characteristics of the aerial vehicle and/or the one or more propellers or propulsion mechanisms may be monitored on any schedule or frequency, in order select or deselect heat pipes as needed or desired to efficiently dissipate heat from components of the aerial vehicle. Moreover, the temperatures of the one or more second components may also be monitored in a similar manner as the temperatures of the one or more electronic components, as in 802, in order select or deselect heat pipes as needed or desired to apply heat to the second components.

Although FIG. 8 is described with respect to the various heat pipe configurations and embodiments as shown in FIGS. 2-6C, at least portions of the process 800 described herein with respect to FIG. 8 may also substantially apply to the cool air duct and cool air pipe configurations and embodiments as shown in FIGS. 7A and 7B.

The cool air ducts and cool air pipes may be selected for connection to one or more electronic components according to the process 800 of FIG. 8. For example, the temperatures of the one or more electronic components may be measured, as in 802, and a determination may be made whether the measured temperatures exceed respective thresholds, as in 804. If not, the process 800 may continue monitoring the temperatures of the one or more electronic components, as in 802.

If the temperature of an electronic component exceeds a respective threshold, the process may determine whether two or more cool air ducts and/or cool air pipes are available for routing airflow to the electronic component, as in 806. If only one cool air duct and cool air pipe is available, then the process selects the available cool air duct and cool air pipe for routing the airflow, as in 808.

If, however, two or more cool air ducts and/or cool air pipes are available for routing airflow to the electronic component, then the process may determine operational characteristics of the aerial vehicle and/or one or more propellers or propulsion mechanisms, as in 810. In addition, the process may measure temperatures of one or more second components that may also receive airflow for cooling, as in 812. If the measured temperatures of the one or more second components do not rise above respective thresholds, as in 814, or if there are no second components whose temperatures are measured and/or to which airflow may be selectively routed for cooling, the process may select a cool air duct and cool air pipe for connection to the electronic component based at least in part on the determined operational characteristics, as in 816. For example, the selected cool air duct and cool air pipe may route airflow to the electronic component from a propeller airflow, a propulsion airflow, and/or a vehicle airflow based on the operational characteristics of the aerial vehicle and/or the one or more propellers or propulsion mechanisms.

If, however, the temperatures of the one or more second components do rise above respective thresholds, the process may select a cool air duct and cool air pipe for connection to the electronic component based at least in part on the determined operational characteristics and the one or more second components to be cooled, as in 818. For example, the selected cool air duct and cool air pipe may be routed from a propeller airflow, a propulsion airflow, and/or a vehicle airflow to, through, or near the one or more second components and also to the electronic component based on the operational characteristics of the aerial vehicle and/or the one or more propellers or propulsion mechanisms and based on the one or more second components that may be cooled.

The process 800 described herein with respect to FIG. 8 with respect to the cool air duct and cool air pipe configurations and embodiments may be repeated as needed or desired, e.g., continuously or intermittently during operation of the aerial vehicle, or at any other interval or frequency. In addition, the operational characteristics of the aerial vehicle and/or the one or more propellers or propulsion mechanisms may be monitored on any schedule or frequency, in order select or deselect cool air ducts and cool air pipes as needed or desired to efficiently route airflow to components of the aerial vehicle. Moreover, the temperatures of the one or more second components may also be monitored in a similar manner as the temperatures of the one or more electronic components, as in 802, in order select or deselect cool air ducts and cool air pipes as needed or desired to route airflow to the second components.

Figure 9:
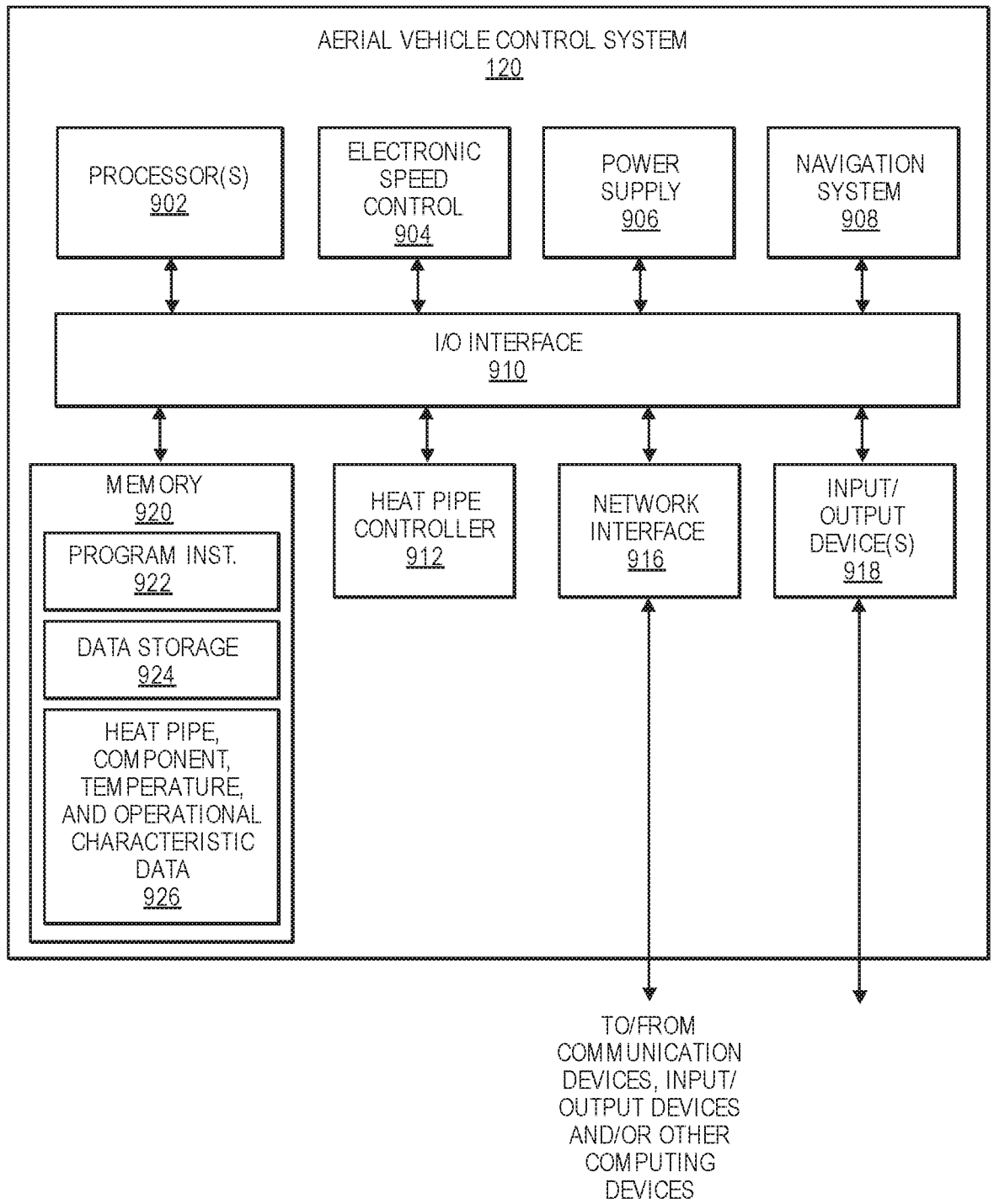
FIG. 9 is a block diagram illustrating various components of an aerial vehicle control system, according to an implementation.

FIG. 9 is a block diagram illustrating various components of an example aerial vehicle control system 120, according to an implementation. In various examples, the block diagram may be illustrative of one or more aspects of the aerial vehicle control system 120 that may be used to implement the various systems and processes discussed above. In the illustrated implementation, the aerial vehicle control system 120 includes one or more processors 902, coupled to a non-transitory computer readable storage medium 920 via an input/output (I/O) interface 910. The aerial vehicle control system 120 may also include an electronic speed control or propulsion controller 904, a power controller/supply module 906 and/or a navigation system 908. The aerial vehicle control system 120 further includes a heat pipe controller 912, a network interface 916, and one or more input/output devices 918.

In various implementations, the aerial vehicle control system 120 may be a uniprocessor system including one processor 902, or a multiprocessor system including several processors 902 (e.g., two, four, eight, or another suitable number). The processor(s) 902 may be any suitable processor capable of executing instructions. For example, in various implementations, the processor(s) 902 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 902 may commonly, but not necessarily, implement the same ISA.

The non-transitory computer readable storage medium 920 may be configured to store executable instructions, data, aerial vehicle data, heat pipe data, aerial vehicle component data, temperature data, aerial vehicle operational characteristic data, and/or other data items accessible by the processor(s) 902. In various implementations, the non-transitory computer readable storage medium 920 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 920 as program instructions 922, data storage 924 and heat pipe, component, temperature, and operational characteristic data 926, respectively. In other implementations, program instructions and/or data may be received, sent or stored upon different types of computer-accessible media, such as non-transitory media, or on similar media separate from the non-transitory computer readable storage medium 920 or the aerial vehicle control system 120.

Generally speaking, a non-transitory, computer readable storage medium may include storage media or memory media such as magnetic or optical media, e.g., disk or CD/DVD-ROM, coupled to the aerial vehicle control system 120 via the I/O interface 910. Program instructions and data stored via a non-transitory computer readable medium may be transmitted by transmission media or signals, such as electrical, electromagnetic, or digital signals, which may be conveyed via a communication medium such as a network and/or a wireless link, such as may be implemented via the network interface 916.

In one implementation, the I/O interface 916 may be configured to coordinate I/O traffic between the processor(s) 902, the non-transitory computer readable storage medium 920, and any peripheral devices, the network interface or other peripheral interfaces, such as input/output devices 918. In some implementations, the I/O interface 910 may perform any necessary protocol, timing or other data transformations to convert data signals from one component (e.g., non-transitory computer readable storage medium 920) into a format suitable for use by another component (e.g., processor(s) 902). In some implementations, the I/O interface 910 may include support for devices attached through various types of peripheral buses, such as a variant of the Peripheral Component Interconnect (PCI) bus standard or the Universal Serial Bus (USB) standard, for example. In some implementations, the function of the I/O interface 910 may be split into two or more separate components, such as a north bridge and a south bridge, for example. Also, in some implementations, some or all of the functionality of the I/O interface 910, such as an interface to the non-transitory computer readable storage medium 920, may be incorporated directly into the processor(s) 902.

The electronic speed control or propulsion controller 904 communicates with the navigation system 908 and adjusts the operational characteristics of each propulsion mechanism to guide the aerial vehicle along a determined flight path and/or to perform other navigational maneuvers. The navigation system 908 may include a GPS or other similar system than can be used to navigate the aerial vehicle to and/or from a location.

The aerial vehicle control system 120 may also include a heat pipe controller 912. The heat pipe controller 912 communicates with components of the aerial vehicle, components of the heat pipes and/or cool air ducts and pipes, and/or any actuators, valves, or other structures associated with the heat pipes and/or cool air ducts and pipes, controls the thermal connections and routing of heat via heat pipes to one or more of propeller airflows, propulsion airflows, vehicle airflows, and/or one or more second components to be heated, and controls the connections and routing of cooling airflow via cool air ducts and pipes from one or more of propeller airflows, propulsion airflows, and/or vehicle airflows to electronic components that generate heat and/or one or more second components to be cooled.

The network interface 916 may be configured to allow data to be exchanged between the aerial vehicle control system 120, other devices attached to a network, such as other computer systems, aerial vehicle control systems of other aerial vehicles, and/or an aerial vehicle management system. For example, the network interface 916 may enable wireless communication between numerous aerial vehicles. In various implementations, the network interface 916 may support communication via wireless general data networks, such as a Wi-Fi network. For example, the network interface 916 may support communication via telecommunications networks such as cellular communication networks, satellite networks, and the like.

Input/output devices 918 may, in some implementations, include one or more displays, image capture devices, temperature sensors, thermal sensors, thermal imaging sensors, infrared sensors, time of flight sensors, accelerometers, pressure sensors, weather sensors, etc. Multiple input/output devices 918 may be present and controlled by the aerial vehicle control system 120.

As shown in FIG. 9, the memory 920 may include program instructions 922 which may be configured to implement the example processes and/or sub-processes described above. The data storage 924 and heat pipe, component, temperature, and operational characteristic data 926 may include various data stores for maintaining data items that may be provided for selecting, operating, and/or controlling heat pipes and/or cool air ducts and pipes for temperature management of components of aerial vehicles.

In various implementations, the parameter values and other data illustrated herein as being included in one or more data stores may be combined with other information not described or may be partitioned differently into more, fewer, or different data structures. In some implementations, data stores may be physically located in one memory or may be distributed among two or more memories.

Each process described herein may be implemented by the architectures described herein or by other architectures. The processes are illustrated as a collection of blocks in a logical flow. Some of the blocks represent operations that can be implemented in hardware, software, or a combination thereof. In the context of software, the blocks represent computer-executable instructions stored on one or more computer readable media that, when executed by one or more processors, perform the recited operations. Generally, computer-executable instructions include routines, programs, objects, components, data structures, and the like that perform particular functions or implement particular abstract data types.

The computer readable media may include non-transitory computer readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some implementations, the computer readable media may include a transitory computer readable signal (in compressed or uncompressed form). Examples of computer readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process. Additionally, one or more of the operations may be considered optional and/or not utilized with other operations.

Those skilled in the art will appreciate that the aerial vehicle control system 120 is merely illustrative and is not intended to limit the scope of the present disclosure. In particular, the computing system and devices may include any combination of hardware or software that can perform the indicated functions, including computers, network devices, internet appliances, PDAs, wireless phones, pagers, etc. The aerial vehicle control system 120 may also be connected to other devices that are not illustrated, or instead may operate as a stand-alone system. In addition, the functionality provided by the illustrated components may, in some implementations, be combined in fewer components or distributed in additional components. Similarly, in some implementations, the functionality of some of the illustrated components may not be provided and/or other additional functionality may be available.

Those skilled in the art will also appreciate that, while various items are illustrated as being stored in memory or storage while being used, these items or portions of them may be transferred between memory and other storage devices for purposes of memory management and data integrity. Alternatively, in other implementations, some or all of the software components may execute in memory on another device and communicate with the illustrated aerial vehicle control system 120. Some or all of the system components or data structures may also be stored (e.g., as instructions or structured data) on a non-transitory, computer-accessible medium or a portable article to be read by an appropriate drive, various examples of which are described above. In some implementations, instructions stored on a computer-accessible medium separate from the aerial vehicle control system 120 may be transmitted to the aerial vehicle control system 120 via transmission media or signals, such as electrical, electromagnetic, or digital signals, conveyed via a communication medium, such as a network and/or a wireless link. Various implementations may further include receiving, sending or storing instructions and/or data implemented in accordance with the foregoing description upon a computer-accessible medium. Accordingly, the techniques described herein may be practiced with other aerial vehicle control system configurations.

Those skilled in the art will appreciate that, in some implementations, the functionality provided by the processes and systems discussed above may be provided in alternative ways, such as being split among more software modules or routines or consolidated into fewer modules or routines. Similarly, in some implementations, illustrated processes and systems may provide more or less functionality than is described, such as when other illustrated processes instead lack or include such functionality respectively, or when the amount of functionality that is provided is altered. In addition, while various operations may be illustrated as being performed in a particular manner (e.g., in serial or in parallel) and/or in a particular order, those skilled in the art will appreciate that, in other implementations, the operations may be performed in other orders and in other manners. Those skilled in the art will also appreciate that the data structures discussed above may be structured in different manners, such as by having a single data structure split into multiple data structures or by having multiple data structures consolidated into a single data structure. Similarly, in some implementations, illustrated data structures may store more or less information than is described, such as when other illustrated data structures instead lack or include such information respectively, or when the amount or types of information that is stored is altered. The various processes and systems as illustrated in the figures and described herein represent example implementations. The processes and systems may be implemented in software, hardware, or a combination thereof in other implementations. Similarly, the order of any process may be changed and various elements may be added, reordered, combined, omitted, modified, etc., in other implementations.

From the foregoing, it will be appreciated that, although specific implementations have been described herein for purposes of illustration, various modifications may be made without deviating from the spirit and scope of the appended claims and the features recited therein. In addition, while certain aspects are presented below in certain claim forms, the inventors contemplate the various aspects in any available claim form. For example, while only some aspects may currently be recited as being embodied in a computer readable storage medium, other aspects may likewise be so embodied. Various modifications and changes may be made as would be obvious to a person skilled in the art having the benefit of this disclosure. It is intended to embrace all such modifications and changes and, accordingly, the above description is to be regarded in an illustrative rather than a restrictive sense.

What is claimed is:

1. An aerial vehicle, comprising:
a body;
at least one motor arm coupled to the body, the at least one motor arm including a motor and a propeller rotated by the motor;
an electronic component coupled to the body, the electronic component generating heat during operation; and
a heat pipe connected at a first end to the electronic component, at least a portion of the heat pipe being routed through a propeller airflow created by rotation of the propeller,
wherein the portion of the heat pipe is routed through the propeller airflow in a pattern that varies over a length of the heat pipe, wherein the pattern is at least one of a rectangular, polygonal, elliptical, or circular pattern.

2. The aerial vehicle of claim 1, wherein the portion of the heat pipe is formed in a shape of an airfoil.

3. The aerial vehicle of claim 1, wherein an outer surface of the portion of the heat pipe includes a heat sink comprising at least one of fins, ribs, or protrusions to increase a surface area of the portion of the heat pipe routed through the propeller airflow.

4. The aerial vehicle of claim 3, wherein the at least one of the fins, ribs, or protrusions is formed in a shape of an airfoil.

5. An aerial vehicle, comprising:
a body;
a motor coupled to the body;
a propeller rotated by the motor;
an electronic component coupled to the body, the electronic component generating heat during operation; and
a heat pipe connected at a first end to the electronic component, at least a portion of the heat pipe being routed at least partially through a propeller airflow created by rotation of the propeller,
wherein the portion of the heat pipe is routed at least partially through the propeller airflow in a pattern that varies over a length of the heat pipe, wherein the pattern is at least one of a rectangular, polygonal, elliptical, or circular pattern.

6. The aerial vehicle of claim 5, wherein the portion of the heat pipe forms a protective grid, screen, or shroud at least partially across the propeller airflow.

7. The aerial vehicle of claim 5, wherein the portion of the heat pipe is routed at least partially through the propeller airflow in a plurality of layers that are substantially parallel to a plane of rotation of the propeller.

8. The aerial vehicle of claim 5, wherein the portion of the heat pipe includes at least one of an elliptical, circular, polygonal, or airfoil cross-sectional shape.

9. The aerial vehicle of claim 5, wherein the portion of the heat pipe includes a heat sink comprising at least one of fins, ribs, or protrusions to increase a surface area of the portion of the heat pipe routed at least partially through the propeller airflow.

10. The aerial vehicle of claim 9, wherein the at least one of the fins, ribs, or protrusions includes at least one of an elliptical, circular, polygonal, or airfoil shape.

11. The aerial vehicle of claim 5, wherein the portion of the heat pipe comprises a propeller frame positioned around a periphery of the propeller airflow, and a plurality of heat sinks coupled to an inner surface of the propeller frame and extending at least partially through the propeller airflow.

12. The aerial vehicle of claim 5, wherein the heat pipe is further routed adjacent a second component, the second component being heated by the heat pipe during operation,
wherein the second component is at least one of an aileron, a flap, a control surface, a motor, a propeller, a power supply, a payload mechanism, or a payload of the aerial vehicle.

13. The aerial vehicle of claim 5, further comprising:
a plurality of propellers including the propeller;
a plurality of heat pipes including the heat pipe, each of the plurality of heat pipes being routed to a respective propeller of the plurality of propellers; and
a controller configured to select the heat pipe from the plurality of heat pipes to connect at the first end to the electronic component based at least in part on respective operations of the plurality of propellers, at least the portion of the heat pipe being routed at least partially through the propeller airflow at the propeller.

* * * * *